US010535909B2

(12) United States Patent
Huang et al.

(10) Patent No.: US 10,535,909 B2
(45) Date of Patent: Jan. 14, 2020

(54) METHODS OF FORMING FLIPPED RF FILTER COMPONENTS

(71) Applicant: Invensas Corporation, San Jose, CA (US)

(72) Inventors: Shaowu Huang, Sunnyvale, CA (US); Belgacem Haba, Saratoga, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 16/133,070

(22) Filed: Sep. 17, 2018

(65) Prior Publication Data

US 2019/0036191 A1  Jan. 31, 2019

Related U.S. Application Data

(62) Division of application No. 15/287,056, filed on Oct. 6, 2016, now Pat. No. 10,109,903.

(51) Int. Cl.
*H05K 1/18* (2006.01)
*H01P 1/203* (2006.01)
(Continued)

(52) U.S. Cl.
CPC ............ *H01P 1/203* (2013.01); *H01P 1/2039* (2013.01); *H01P 1/20354* (2013.01);
(Continued)

(58) Field of Classification Search
CPC ... H01L 21/6833; H01L 25/0652–0657; H01P 1/203; H01P 1/2039; H03H 9/54
(Continued)

(56) References Cited

U.S. PATENT DOCUMENTS 4,074,214 A   2/1978  Aichholzer
5,426,566 A *  6/1995  Beilstein, Jr. ....... H01L 25/0652
                                              257/686
(Continued)

OTHER PUBLICATIONS

International Search Report and Written Opinion for PCT Application No. PCT/US2017/055260, dated Jan. 24, 2018, 20 pages.

*Primary Examiner* — Tuan T Dinh

(57) ABSTRACT

Methods of forming flipped radio frequency (RF) filter components are provided. An example method for miniaturizing conventional planar RF filters comprises: determining radio frequency (RF) filtering characteristics of a conventional planar microstrip RF filter or a conventional stripline RF filter, determining distributed RF filter elements for emulating the RF filtering characteristics of the conventional planar microstrip RF filter or the conventional stripline RF filter, creating each distributed RF filter element on a substrate, laminating a stack of the distributed RF filter elements into a single solid RF filter module; and mounting the single solid RF filter module on a horizontal substrate to vertically dispose the distributed RF filter elements of the stack. The methods create laminated stacks of distributed RF filter elements that provide a dramatic reduction in size over the horizontal planar RF filters that they replace. Deposited conductive traces of an example flipped RF filter stack provide various stub configurations of an RF filter and emulate various distributed filter elements and their configuration geometries.

19 Claims, 28 Drawing Sheets

(51) Int. Cl.
*H05K 1/16* (2006.01)
*H01P 11/00* (2006.01)
*H05K 1/02* (2006.01)
*H05K 3/46* (2006.01)

(52) U.S. Cl.
CPC ...... *H01P 1/20363* (2013.01); *H01P 1/20372* (2013.01); *H01P 11/007* (2013.01); *H05K 1/0203* (2013.01); *H05K 1/16* (2013.01); *H05K 1/181* (2013.01); *H05K 1/182* (2013.01); *H05K 1/0233* (2013.01); *H05K 1/185* (2013.01); *H05K 3/4611* (2013.01)

(58) Field of Classification Search
USPC .............................. 361/760–790; 29/830–852
See application file for complete search history.

(56) References Cited

U.S. PATENT DOCUMENTS

| | | | |
|---|---|---|---|
| 5,892,287 A * | 4/1999 | Hoffman | H01L 21/6833 257/686 |
| 6,064,285 A | 5/2000 | Harron et al. | |
| 6,128,201 A | 10/2000 | Brown et al. | |
| 6,414,570 B1 | 7/2002 | Dalconzo et al. | |
| 7,023,315 B2 | 4/2006 | Yeo et al. | |
| 7,142,165 B2 | 11/2006 | Sanchez et al. | |
| 7,659,799 B2 | 2/2010 | Jun et al. | |
| 7,795,995 B2 | 9/2010 | White et al. | |
| 8,310,841 B2 * | 11/2012 | Foster, Sr. | H01L 25/0657 361/782 |
| 9,030,275 B2 | 5/2015 | Nummerdor | |
| 9,136,574 B2 | 9/2015 | Kim et al. | |
| 2003/0119345 A1 | 6/2003 | Wu | |
| 2008/0310076 A1 | 12/2008 | Ritter et al. | |
| 2011/0001584 A1 | 1/2011 | Enokihara | |
| 2011/0080235 A1 * | 4/2011 | Ninomiya | H01P 1/20345 333/204 |
| 2011/0157857 A1 * | 6/2011 | Matsumoto | H05K 1/0224 361/803 |
| 2012/0256701 A1 * | 10/2012 | Solski | H03H 7/463 333/132 |
| 2013/0307639 A1 * | 11/2013 | Mori | H03H 9/725 333/133 |
| 2013/0335171 A1 * | 12/2013 | Yamato | H03H 9/059 333/193 |
| 2014/0104284 A1 | 4/2014 | Shenoy et al. | |
| 2016/0126174 A1 | 5/2016 | Shen et al. | |
| 2016/0126607 A1 * | 5/2016 | Leipold | H01P 1/20381 333/161 |

* cited by examiner

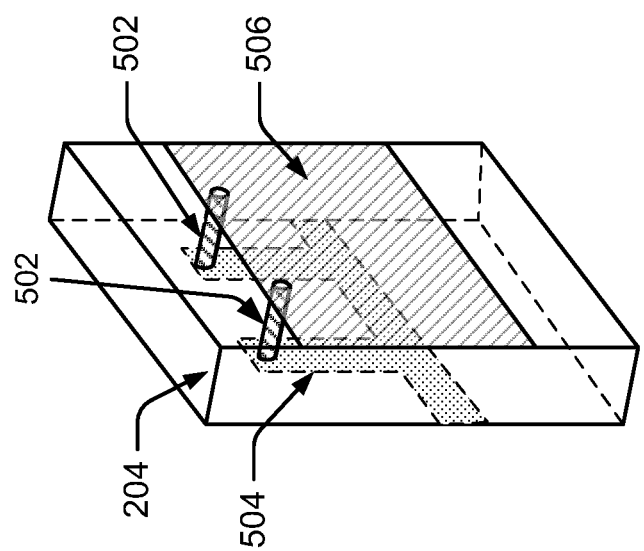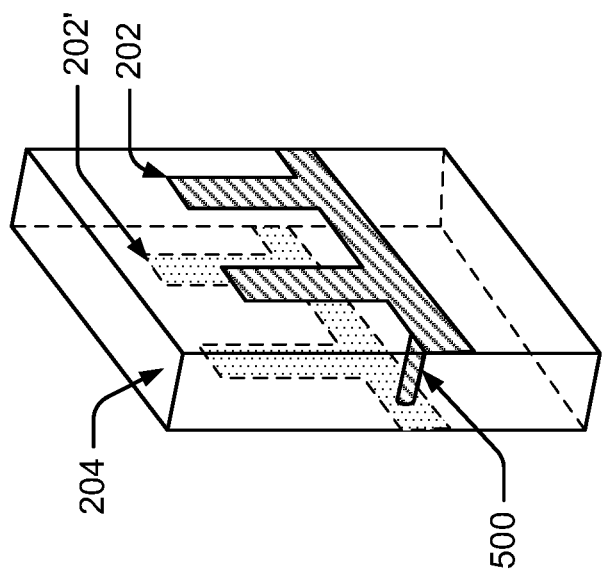
FIG. 5

METHODS OF FORMING FLIPPED RF FILTER COMPONENTS

CROSS-REFERENCE TO RELATED APPLICATION(S)

This application is a divisional of and hereby claims priority to U.S. patent application Ser. No. 15/287,056, filed Oct. 6, 2016, the entirety of which is hereby incorporated by reference herein for all purposes.

BACKGROUND

Radio frequency (RF) and microwave filters and components (such as resonators, couplers, inductors, etc) are used in the wireless communication arts (for example, in cell phones and Wi-Fi) and in broadcast radio and television for filtering media signals at extremely high frequencies in the megahertz to gigahertz frequency ranges. Most devices that transmit or receive a signal, either by wire or through the air, include at least one such RF or microwave filter.

The complete RF spectrum includes the microwave band of frequencies at approximately 1-100 GHz (wavelength of 1 meters to 1 millimeters in package dielectric medium), so "RF filter" as used herein may include microwave filters, without explicitly being stated. Microwave filters are used in such technologies as radar, mobile and satellite communications, remote-sensing systems, measurement, and even electronic warfare, for example. Microwave filters perform the same function as RF filters in general, but circuit dimensions and the more exclusive use of distributed circuit elements instead of lumped-element capacitors and inductors reflect the filtering of higher frequency and shorter wavelengths in the microwave band as compared with other longer wavelength radio and communication signals.

Such RF and microwave filters may be used in components that either separate multiple frequency bands or combine the bands. Bandpass filters, for example, select only a desired band of frequencies out of a wider range, while band-stop filters eliminate an undesired band of frequencies. Lowpass filters allow only frequencies below a selected cutoff frequency to pass, while highpass filters allow only frequencies above a selected cutoff frequency to pass. Most RF and microwave filters are made up of one or more coupled resonators. The unloaded "quality factor" of the resonators used in a given filter determines how precisely it can select between frequencies. Thus, the operation of a microwave filter, for example, depends on resonant frequencies and the coupling coefficients of coupled resonators.

A "distributed element" type of RF filter has circuit elements that are not localized in discrete capacitors and inductors. The distributed elements are short lengths of the conducting circuit itself in various geometries and separated segments that cause a discontinuity in an applied AC signal. These discontinuities present a reactive impedance to a wavefront of the signal traveling down the line. The geometry of the distributed elements can be selected so that these "reactances" approximate inductors, capacitors, and resonators of a desired theoretical RF filter design. A resonant circuit, tank circuit, or tuned circuit is usually an LC circuit, the "L" representing one or more inductors, and the "C" representing one or more capacitors.

Distributed element RF filters often make use of stubs, which are geometrical side branches of the circuit, to emulate capacitors or inductors (determined by a stub's length, for example). Over a wide band, the stub can behave as a resonator. For example, an open-circuit quarter-wavelength stub behaves as a series LC resonator while a quarter-wavelength stub that is short-circuited to ground behaves as a shunt LC anti-resonator.

Coupled lines may also be used as distributed filter elements. Like stubs, coupled lines can act as resonators and likewise be terminated as short-circuited or open-circuited. Coupled lines tend to be preferred in planar technologies, where they are easy to implement. Theoretically, a true open circuit in planar technology is not ideally feasible because the dielectric effect of the substrate always maintains some small shunt capacitance providing some degree of short-circuit.

Microstrip conduction lines can also make good resonators for filters, as can stripline and coplanar waveguide (CPW) circuits, which are formed of a conductor separated from a pair of ground planes, all on the same plane atop a dielectric medium. The processes used to manufacture microstrip circuits are similar to the processes used to manufacture printed circuit boards and so this type of RF filter construction has the characteristic of being largely planar.

Distributed element RF and microwave filters, however, have the disadvantage of taking up much planar area or "real estate" on a motherboard or substrate, while filters made with discrete components are bulky in all three dimensions because of the components.

The proposed RF filter structures and methods described herein are also applicable to numerous other types of RF components, including resonators, couplers, inductors, capacitors, and so on.

SUMMARY

Flipped radio frequency (RF) and microwave filters for compact package assemblies are provided. An example RF filter is constructed by depositing a conductive trace, such as a redistribution layer, onto a flat surface of a substrate, to form an RF filter element. The substrate is vertically mounted on a motherboard, thereby saving dedicated area. Multiple layers of substrate can be laminated into a stack and mounted so that the RF filter elements of each layer are in vertical planes with respect to a horizontal motherboard, providing dramatic reduction in size. Deposited conductive traces of an example flipped RF filter stack can provide various stub configurations of an RF filter and emulate various distributed filter elements and their configuration geometries. The deposited conductive traces can also form other electronic components to be used in conjunction with the RF filter elements. A wirebond or bond via array (BVA™) version can provide flipped RF and microwave filters (Invensas Corporation, San Jose, Calif.).

This summary is not intended to identify key or essential features of the claimed subject matter, nor is it intended to be used as an aid in limiting the scope of the claimed subject matter.

BRIEF DESCRIPTION OF THE DRAWINGS

Certain embodiments of the disclosure will hereafter be described with reference to the accompanying drawings, wherein like reference numerals denote like elements. It should be understood, however, that the accompanying figures illustrate the various implementations described herein and are not meant to limit the scope of various technologies described herein.

FIG. 5 is a diagram of example through-substrate vias for connecting RF filter elements to each other or to a ground plane.

DETAILED DESCRIPTION

Overview

Figure 1:
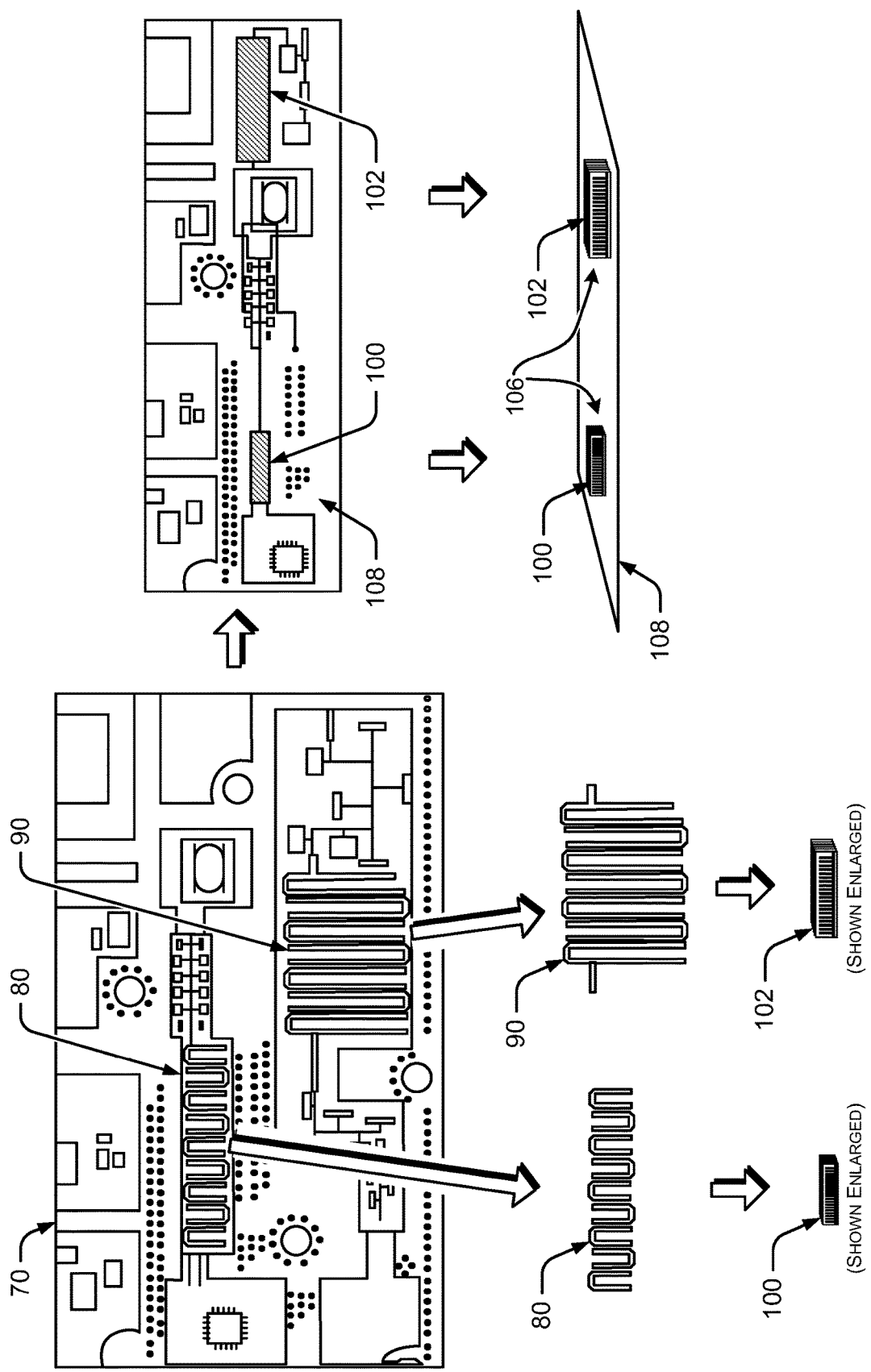
FIG. 1 is a diagram of example compact RF filter packages in replacement of conventional larger planar RF filters.

This disclosure describes example flipped RF and microwave filters for compact package assemblies. As shown in FIG. 1, example RF filter packages 100 & 102 (shown much larger than actual scale) and microwave filters described herein can provide a dramatic reduction in component size that reduces footprint and saves space on a motherboard 70 over conventional planar microstrip or stripline RF filters 80 & 90, for example. The term "flipped" means that deposited metal traces on a planar substrate that make up a miniaturized RF filter element are rotated 90 degrees (from conventional planar) and mounted vertically 106 to a horizontal motherboard 108, or that the RF filter elements are disposed in planes that are perpendicular to the motherboard. This vertical disposition 106 applies to individual RF filter elements on a single substrate, and also applies to laminated stacks 100 & 102 of such RF filter elements on corresponding laminated substrates.

For laminated stacks 100 & 102 of the RF filter elements making up an RF filter package, the plurality of RF filter elements present may or may not be conductively connected to each other, for example in series or in parallel. The smaller size of each RF filter element formed by a deposited metal trace and the vertical mount 106 of their planar substrates on the horizontal motherboard 108 can save a great deal of layout area on the motherboard 108, as opposed to conventional RF filters 80 & 90. Moreover, the layout of conductive features of the RF filter elements may be tilted or slanted, as shown further below, within their vertical mounting planes to further reduce a height of the RF filter stacks or packages 100 & 102 on the motherboard 108.

Figure 2:
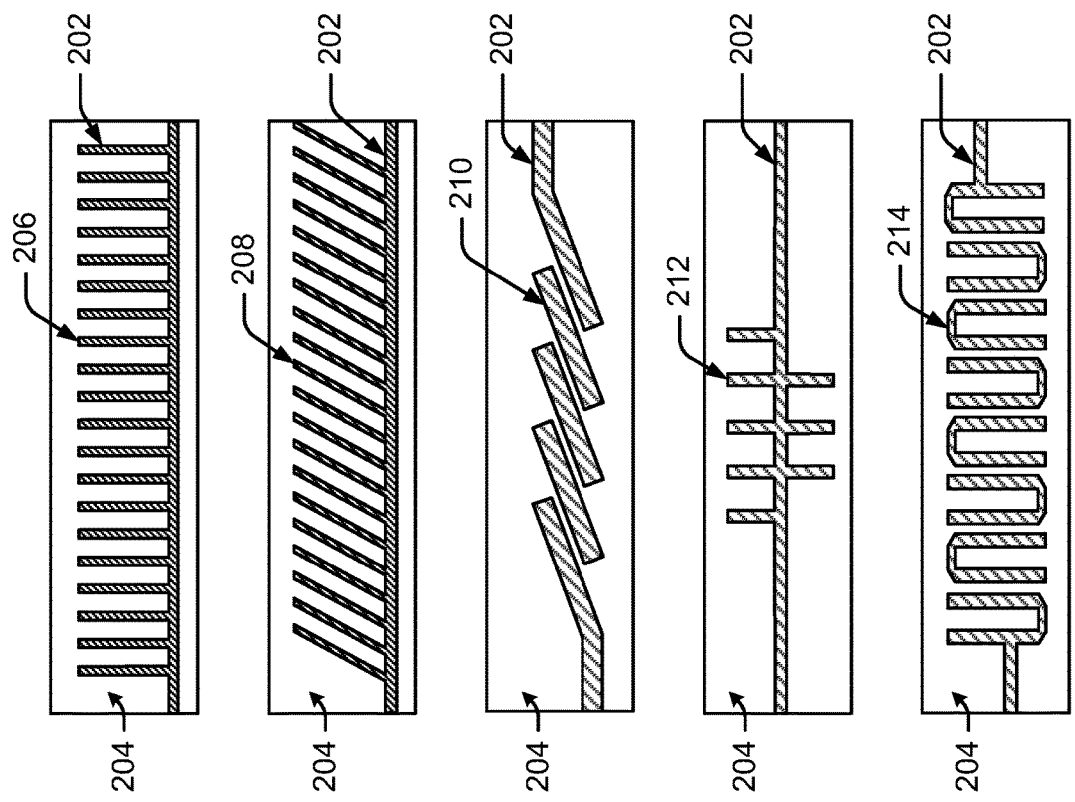
FIG. 2 is a diagram of example distributed element RF filter element design styles.

FIG. 2 shows example RF filter elements. Each RF filter element is constructed by depositing a conductive trace 202, such as the metal lines of a redistribution layer, onto a flat surface of a substrate 204, to form the RF filter element 202. The substrate 204 with the conductive trace 202 can form a single RF filter element (202) on the substrate 204, which can then be vertically mounted on a motherboard 108, thereby saving space over conventional planar RF filters 80 & 90. Multiple instances of the same or different RF filter elements 202 can be laminated together into the layers of a stack 100 & 102 and mounted 106 so that the RF filter elements 202 of each layer are in vertical planes with respect to a horizontal motherboard 108, providing a dramatic reduction in area needed for the RF filter package 100 on the motherboard 108, and saving vertical space too.

The deposited conductive traces 202 of an example flipped RF filter stack 100 & 102 can provide various stub configurations 206 & 208 of various RF filter designs, and/or can emulate various distributed RF filter elements 210 & 212 & 214 and their configuration geometries. The RF filtering properties of a given RF filter element 202 can be modified by selecting the number of stubs 206 & 208, for example, the length of the stubs, how close the stubs 206 & 208 are to each other, variation in the stubs, stub width or diameter, and dielectric properties (dielectric constant) of the materials used and their configuration. These factors also determine the resolution and quality factor of a given RF filter element 202.

The deposited conductive traces 202 can form other electronic components to be used in conjunction with the RF filter elements 202, such as ground and power planes, couplers, via-less interconnects, inductors, coils, resonators, resistors, sensors, RFID tags, antennae, charge-receiving inductance coils, transformers, radio frequency (RF) shields, at least parts of a Faraday cage, heat sinks, heat spreaders, and plates of a capacitor, for example.

The example laminating processes for making a stack 100 & 102 of RF filter elements 202 may also embed other discrete components between the laminated layers, or recessed in a substrate layer 204 or within an intra-layer adhesive. The discrete components that may be embedded during lamination may include active or passive electronic components, a transformer associated with an RF filter design, a shunt, an interconnect, an inductor, a coil, and so forth.

A wirebond or bond via array (BVA™) version of the example RF filters, to be described further below, can also provide flipped RF and microwave filters (Invensas Corporation, San Jose, Calif.).

Example Construction Processes for RF Filter Elements

Figure 3:
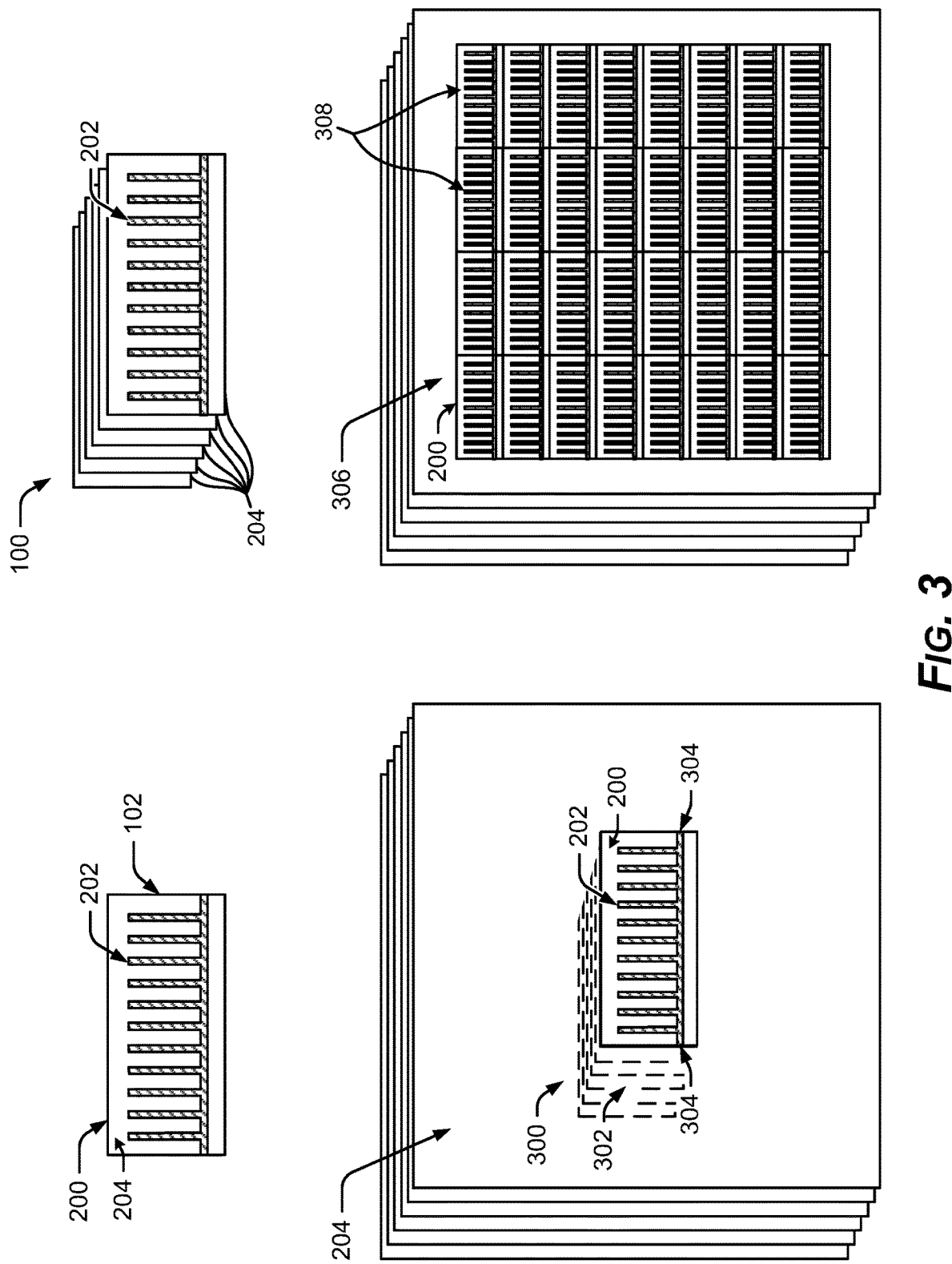
FIG. 3 is a diagram of RF filter elements in a laminated stack assembly process.

As shown in FIG. 3, example processes for making an RF filter element 202 or package achieve a flipped RF filter package 100 by forming or depositing circuit traces 202 (conductive metal lines, or printed circuits) on an outside surface of each of multiple substrates 204 or panes (that is, a board, panel, pane, sheet, wafer or other substrate form that can be made of a wide variety of materials), and then laminating the substrates 204 into a stack 100 comprising the RF filter package 100, thereby embedding most or all of the conductive traces 202. The trace conductors 202 become embedded between laminated layers. Laminating can include one or more of adhering, layering, joining, or fusing the multiple layers together.

Material for the panes of substrate 204 may be dielectric, glass, epoxy, polymer, molding material, a liquid crystal polymer (LCP), a low temperature co-fired ceramic (LTCC), a high temperature co-fired ceramic (HTCC), sintered layers of ceramic green sheets, and so forth. In some circumstances the material may be a semiconductor, or silicon. The substrate 204 may also be made of alumina to prevent dielectric losses at microwave frequencies. Planar filter elements of high precision can be made by thin-film processes. Low loss tangent dielectric materials, such as quartz and sapphire can be used as the substrate 204 to achieve high Q factor RF filter elements 202, especially when used with low resistance metals such as silver or gold. Each pane of substrate 204 or may be thinned, prior to laminating into a stack 300. For example, each substrate 204 may be thinned to around 2-200 microns, for example.

In an implementation, a laminated stack 300 of substrates 204 can be sliced to desired dimensions of an RF filter 300. A sliced side 302 of the laminated stack 300 reveals access to conductive ends 304 of the metal trace patterns 202 forming the electrically operational parts of the RF filter elements 202. Slicing cuts through the thickness dimension of each of the stacked substrates 204, revealing the conductive ends 304 of the trace pattern 202 laid on each substrate 204 or pane. The example RF filter packages 100 & 102 and their dimensions are not shown to relative scale in the Figures herein, for example, thicknesses are exaggerated to illustrate features.

In an implementation, the conductive traces 202 are formed, placed, deposited, plated, sputtered, or otherwise applied, onto a surface, such as the flat surface of the substrate 204. The conductive traces 202 may be conductive trace lines, a trace pattern, a metal plane, a printed circuit pattern of conductive lines, a redistribution layer, wires, leads, pads, or other conductors. The example construction achieves vertical conductive RF filter patterns in the RF filter package 100 by depositing the conductive traces 202 on the multiple panes of the substrate 204, and then laminating these panes of the substrate 204 into a stack 300 that becomes the laminated RF filter 300.

The panes of substrate 204 can be sliced from larger boards, sheets, wafers, or larger panels 306 of material. By placing repetitive instances 308 of an RF filter trace pattern 202 across the surface of a single panel 306, or across the surfaces of multiple panels 306, the panels 306 may be stacked and singulated through dicing or other slicing methods, into numerous instances of substrate panes 204 for the RF filter stack 300. A different conductive trace pattern 202 may be used for each layer of panel 306 to be laminated into the stack 300, depending on the particular RF filter package 300 being constructed.

The stacked panels 306 that have multiple instances of the conductive traces 202 that form RF filter elements may be sliced by a water jet, diamond saw, or dicing blade, for example, into singulated individual RF filter packages 300. One or more redistribution layers (RDLs) may be added to a side surface 302 or another surface of each RF filter package 300.

Figure 4:
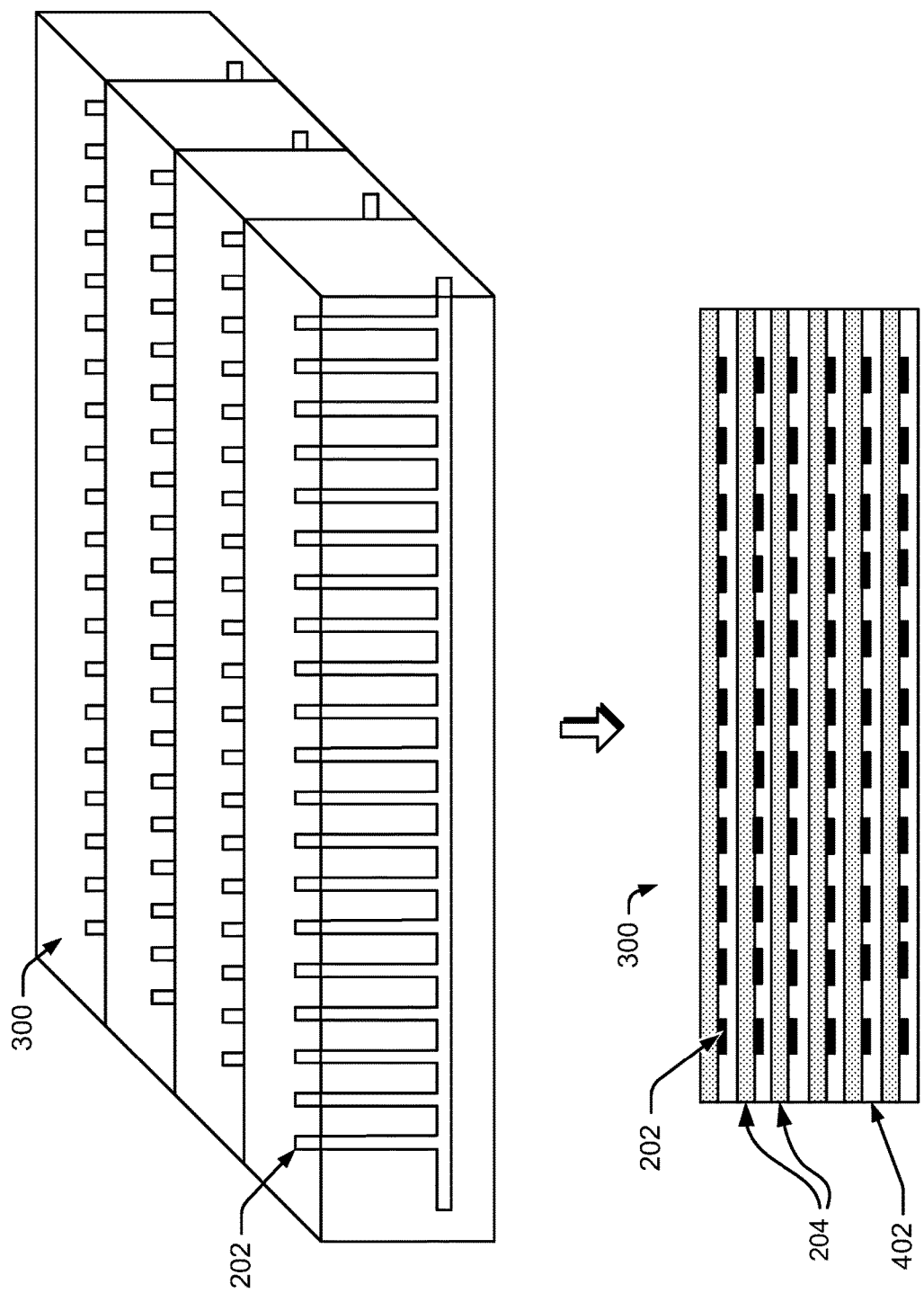
FIG. 4 is a top view of an example RF filter package.

FIG. 4 shows a top view of the example RF filter package 300. The top of the example RF filter package 300 results from a slicing operation through a stack of panels 306, unless the RF filter package 300 is assembled from individual substrate panes 204. The top view of the example RF filter package 300 reveals an edge-on view of the thickness dimension, or side edges 302, of the stacked panels 306 or substrates 204, with the conductive traces 202 forming the RF filter geometry sandwiched between the stacked and laminated panels 306 or substrates 204.

The interposing material 402 between layers of substrate 204 may be joining agents, underfill materials, or adhesives for adhering or joining the panes of substrate 204 into the laminated stack 300. The joining may be achieved using organic or nonorganic adhesives, for example. Glass frits joining, PCB techniques, silicon dioxide joining, glass solder joining, polymer adhesive joining, and metal-to-metal, or metal-to-metal with solder/fusion joining are a few of the techniques and processes that can be employed for laminating the panes of substrate 204 into the laminated stack 300. A low coefficient-of-thermal-expansion material, or a low coefficient-of-thermal-expansion adhesive, may also be used.

In an implementation, one or more electrical connections may be made on the top surface of the RF filter package 300, when one or more leads, branches, vias, or interconnects of the metal trace 202 is extended up to the top surface. Since a conductive trace 202 extending to the top surface is a vertical "through-via," such a vertical through-via may be referred to as a "via-less" interconnect, since the vertical conductor occurs because of lamination, without a hole being drilled or created in the RF filter package 300 for the vertical conductor.

FIG. 5 shows optional through-substrate vias 500 & 502, which traverse the thickness of a given substrate 204 or panel 306. The through-substrate vias 500 & 502 are created before substrate layers 204 are laminated together, by drilling or etching holes in the substrate 204, and metalizing the holes, for example. In an implementation, an example through-substrate via 500 connects an RF filter trace 202 one side of a given pane of the substrate 204 with a second RF filter trace 202' on the opposing side. The second RF filter trace 202' may be deposited on the backside of the same substrate 204 as the first RF filter trace 202, or may be deposited on the frontside of the next adjacent pane of the substrate 204. When the first RF filter trace 202 and the second RF filter trace 202' are on opposing sides of the same pane of substrate 204, then laminating the plurality of substrates together in parallel planes may be accomplished with intervening nonconductive layers in making the stack of the RF filter package 300, rather than relying on the insulative properties of the substrates 204 to provide electrical insulation between adjacent RF filter elements 202 in the stack 300. The intervening nonconductive layers prevent the RF filter elements 202 & 202' on both front and back of the substrates 204 from coming into face-to-face contact with each other, between the multiple substrates 204.

Through-substrate vias 502 can also play an important role for certain types of RF filters 300 created by certain designs of the conductive trace 202. For example, distributed element RF filters 300 often utilize stubs 504 short-circuited to electrical ground. Over a narrow range of frequencies, a stub 504 can be used as a capacitor or an inductor with impedance determined by its length. But over a wide band, the stub 504 behaves as a resonator. For example, an open-circuit quarter-wavelength stub behaves as a series LC resonator, while a quarter-wavelength stub 504 that is short-circuited to electrical ground using a through-substrate via 502 to a ground plane 506, for example, behaves as a shunt LC anti-resonator.

The multiple conductive trace elements 202 inside a given RF filter package 300 can also be connected together externally, through an external jumper, coupler, or redistribution layer deposited on a side where the conductive trace elements 202 are accessible.

Figure 6:
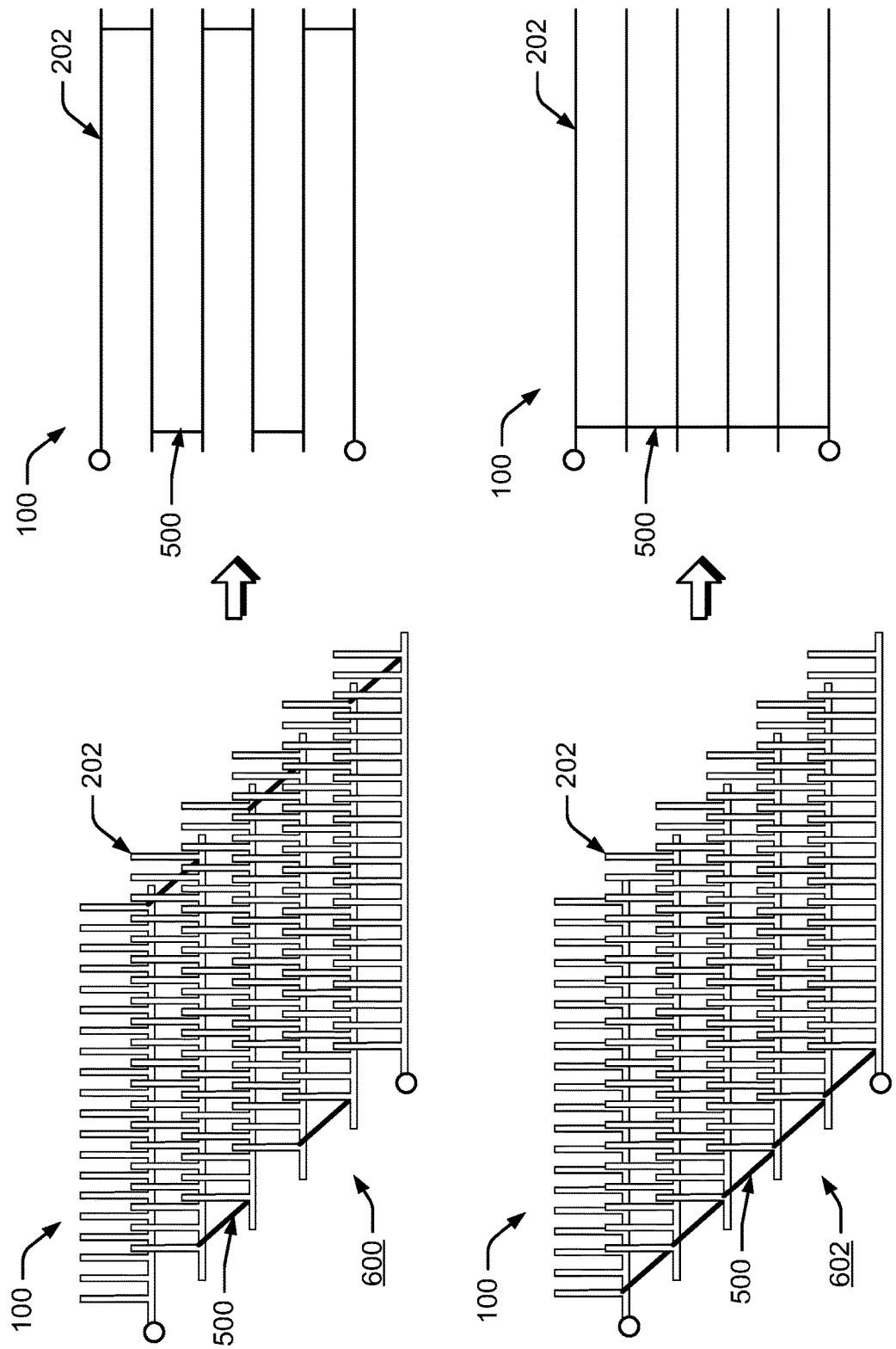
FIG. 6 is a diagram of example connection of RF filter elements together in electrical series or in electrical parallel.

FIG. 6 shows more through-substrate vias 500, being used to connect multiple conductive trace elements 202 together within a given RF filter package 100. In an implementation, the conductive through-substrate vias 500 conductively connect multiple RF filter elements 202 in a series electrical connection 600. In another implementation, the conductive through-substrate vias 500 conductively connect multiple RF filter elements 202 in a parallel electrical connection 602. When connected in series 600 by the through-substrate vias 500, the multiple RF filter elements 202 can form an extended folded RF filter element, or an extended serpentine RF filter element interleaved between a plurality of the substrates 204. The series connection 600 of the multiple RF filter elements 202 can form a very long RF filter element, folded into a very small RF filter package 100.

Figure 7:
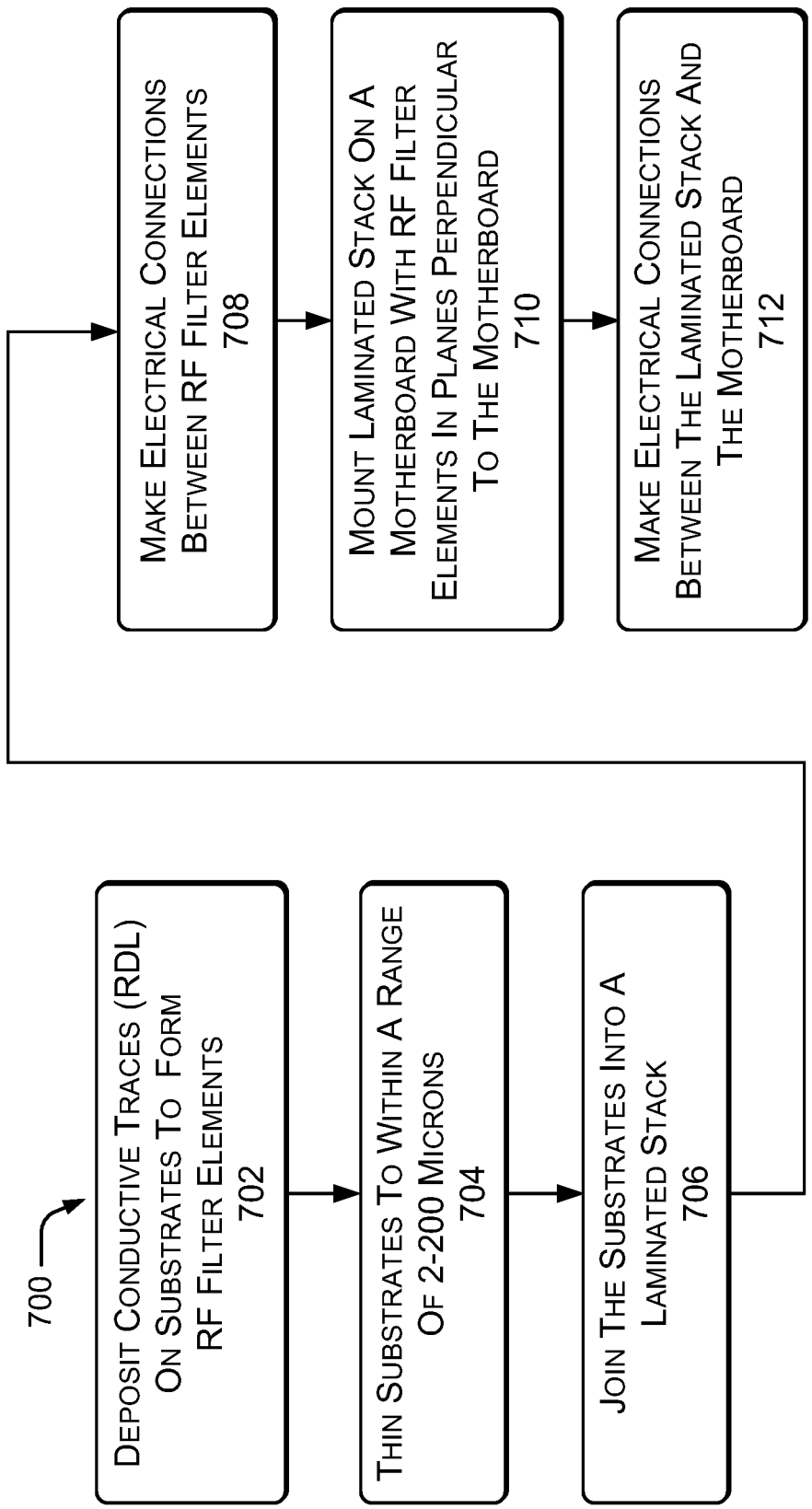
FIG. 7 is a flow diagram of an example process for making an example RF filter package.

FIG. 7 shows an example process 700 for making an example RF filter package 100, capable of replacing conventional microstrip or stripline RF filters that take up much more area on a motherboard. Operations of the example process 700 are shown as individual blocks.

At block 702, conductive traces 202, such as a redistribution layer, are deposited on substrates 204 to form RF filter elements (202).

At block 704, the substrates 204 are thinned to a selected thickness, such as 2-200 microns. This step may come before or after the deposition of the conductive traces 202.

At block 706 the (thinned) substrates 204 are joined together into a laminated stack 100. The laminating can include one or more of adhering, layering, joining, fusing, and so forth.

At block 708, electrical connections are made, as needed for the particular RF filter package 100, between the RF filter elements. The electrical connections can be made before, during, or after the lamination process. For example, through-substrate vias 500 & 502 can be made on individual panes of the substrate 204, especially if the given substrate 204 has a conductive trace 202 on both of its sides. Discrete RF and non-RF electronic components, such as chips, dies, inductors, capacitors, resistors can also be added before lamination, in some circumstances. Also, the deposited conductive traces 202 can also form electronic components that are not RF filter elements, but can be formed from the conductive traces 202, as described further below. Electrical connections made during lamination can include the option of making through-substrate vias 500 & 502 through one or more of the panes of substrate 204 as each individual pane of substrate 204 is added to the stack 100. Making electrical connections after lamination can include placing couplers and jumpers on a side of the stack 100 where the terminal ends of the RF filter elements 202 can be accessed. These connections, for example on a sliced side of the stack 100, can take the form of a redistribution layer (RDL), or other circuit feature.

At block 710, the laminated stack 100 can be mounted on a motherboard with the RF filter elements in planes perpendicular to the motherboard. The planar area that the small RF filter elements 202 would take up if laid out horizontally on the motherboard are flipped on edge, so that the planes are vertical to a horizontal motherboard, saving the respective planar area of the motherboard.

At block 712, electrical connections are made between the laminated stack 100 and the motherboard. The electrical connection to the motherboard can be implemented in the same step as physically mounting the laminated stack 100 on the motherboard. The RF filter elements 202 of the RF filter package 100, and other electronic components that may be present in the RF filter package, are electrically coupled to circuits on the motherboard. The RF filter package 100 may be connected to the motherboard with soldered connections, or other ways of making physical and electrical connection between the RF filter package 100 and the motherboard.

The example process 700 can also be applied to a single pane of substrate 204 with a single RF filter element 202. This type of implementation can be summarized as depositing a conductive trace onto a flat surface of a substrate, the conductive trace forming a radio frequency (RF) filter element, and creating at least one attachment for mounting the substrate vertically on a motherboard.

For the various implementations, the conductive trace 202 can be a redistribution layer, a trace pattern, a trace line, and a printed circuit pattern of conductive lines. In a wirebond implementation, as described further below, the conductive trace 202 is implemented instead with patterns of wires.

Figure 8:
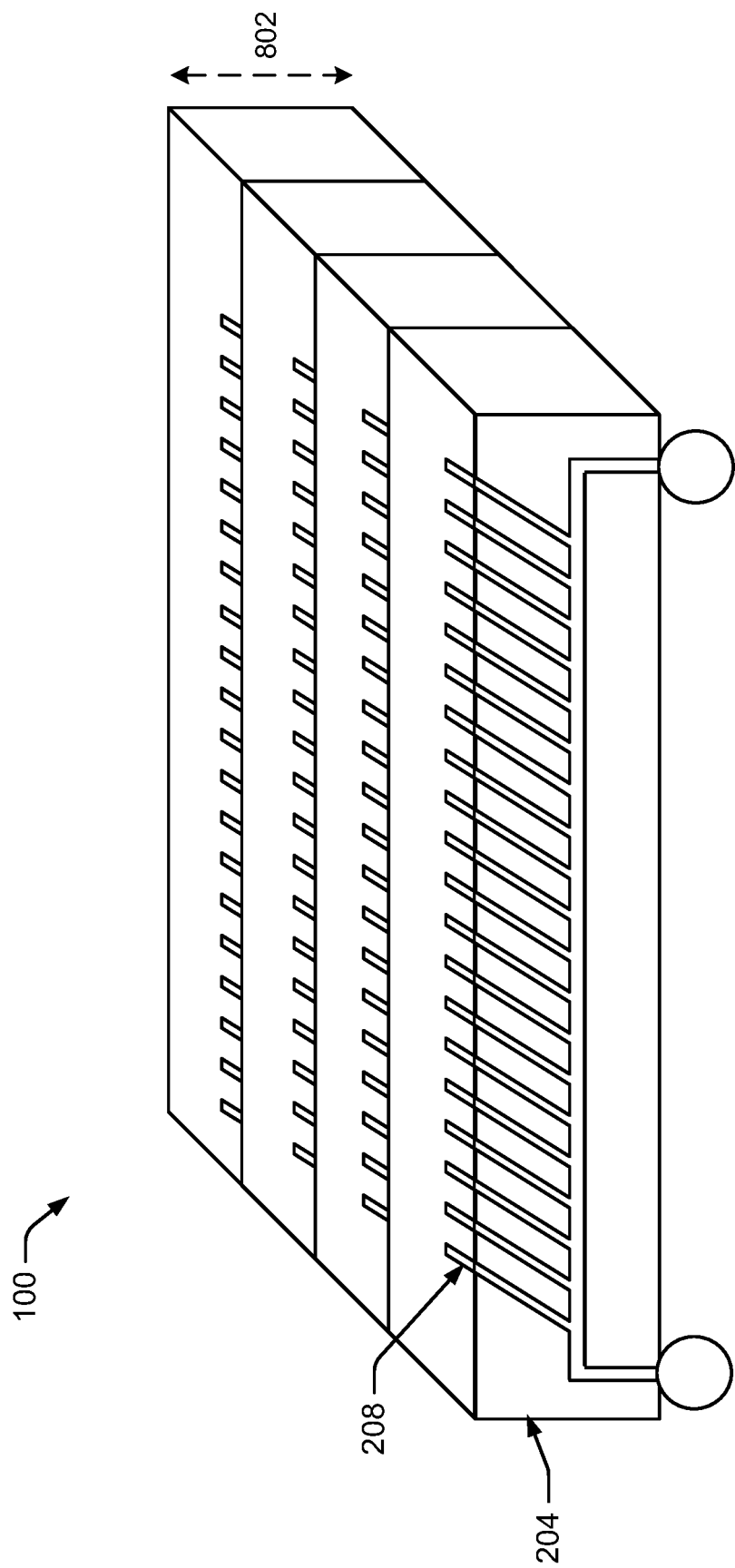
FIG. 8 is a diagram of an example RF filter package with slanted open-circuit stubs in parallel with a main line of an RF filter element.

FIG. 8 shows an example embodiment of the conductive traces 208. As shown in FIG. 8, the physical or geometric features of the RF filter elements 208, as formed by the conductive traces, can be slanted or tilted, while remaining within the plane of the substrate 204, in order to concentrate the features of an RF filter element 208 in a smaller vertical planar area to reduce the footprint of each RF filter element 208 on the respective vertical substrate 204. This slanting of RF element features can reduce the height 802 of the substrate 204 when vertically mounted, and thereby reduce the height 802 of the entire RF filter package 100.

The example RF filter stack 100 may be sliced or singulated from a stack of larger panels 306 or wafers, slicing in a plane perpendicular to the parallel planes of lamination to create a sliced surface exposing a lead of at least one of the conductive traces of the stack. The exposed leads can be used for making the electrical connections between the RF filter elements 202 of the various layers of substrate 204, or for conductively coupling the sliced surface to the horizontal motherboard.

Figure 9:
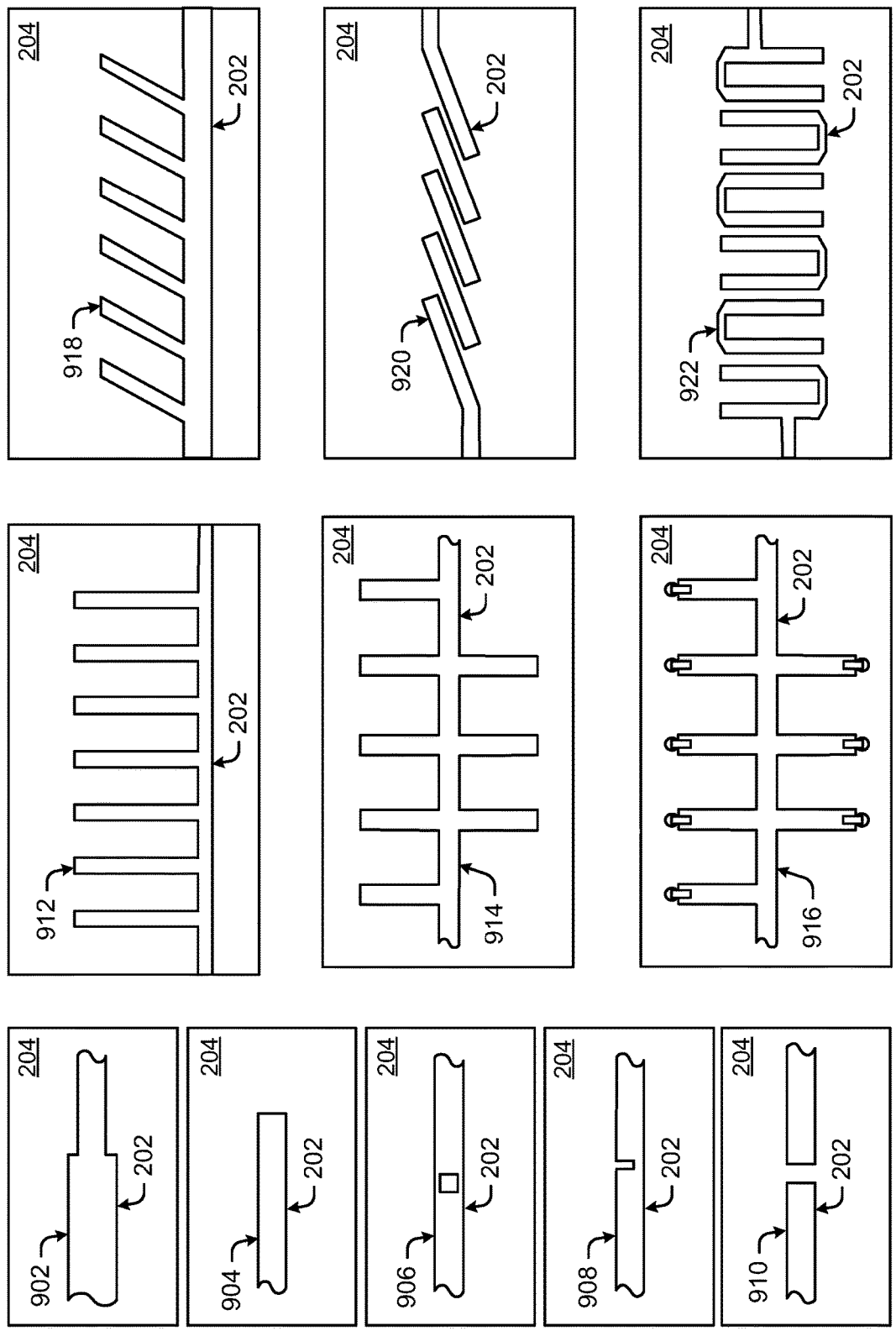
FIG. 9 is a diagram of additional example RF filter elements and design configurations.

FIG. 9 shows additional example types of RF filter element 202 designs.

Each example RF filter element 202 is constructed by depositing a conductive trace onto a flat surface of a substrate 204, to form an RF filter element 202 on the substrate 204. The deposited conductive traces 202 of an example flipped RF filter stack 100 can provide various configurations of RF filter design, and/or can emulate various distributed RF filter elements 202 and their configuration geometries.

Distributed element RF filter elements 202 may include a line having an abrupt change in width to provide a stepped impedance 902, a line having an abrupt end 904, a line possessing a hole or a slit 906, a line possessing a transverse half-slit across the line 908, a line possessing a gap 910, open-circuit stubs in parallel with a main line 912, a line possessing stubs λ/4 apart on alternating sides of the line 914, a line possessing λ/4 stubs short-circuited to ground 916, slanted open-circuit stubs in parallel with a main line 918, parallel-coupled lines 920, and lines comprising a hairpin RF filter configuration 922.

Other or additional distributed element RF filter elements 202 may include a line incorporating shunt resonators to provide a stepped-impedance lowpass filter, a line possessing alternate high and low impedance sections to provide a stepped-impedance lowpass filter, a line short-circuited to ground and coupled to a main line of the conductive trace 202, coupled lines each short-circuited to ground, coupled open-circuit lines, paralleled radial stubs comprising butterfly stubs, doubled stubs in parallel, radial stubs, triple paralleled radial stubs comprising clover-leaf stubs, lines comprising an interdigital filter configuration, lines comprising a capacitive gap filter, and numerous other known in the art, and usable as deposited conductive trace designs that can comprise or emulate distributed element RF filter elements 202.

Stubs 912 can also be used in conjunction with impedance transformers to build more complex RF filters and are useful in bandpass applications. While open-circuit stubs 912 are easier to manufacture in planar technologies because they do not have to be shunted to ground, they have the drawback that the termination deviates significantly from an ideal open circuit, often leading to a preference for the short-circuit stubs 916. In fact, one can be used in place of the other by adding or subtracting λ/4 to or from the length of the stub 914 & 916.

Figure 10:
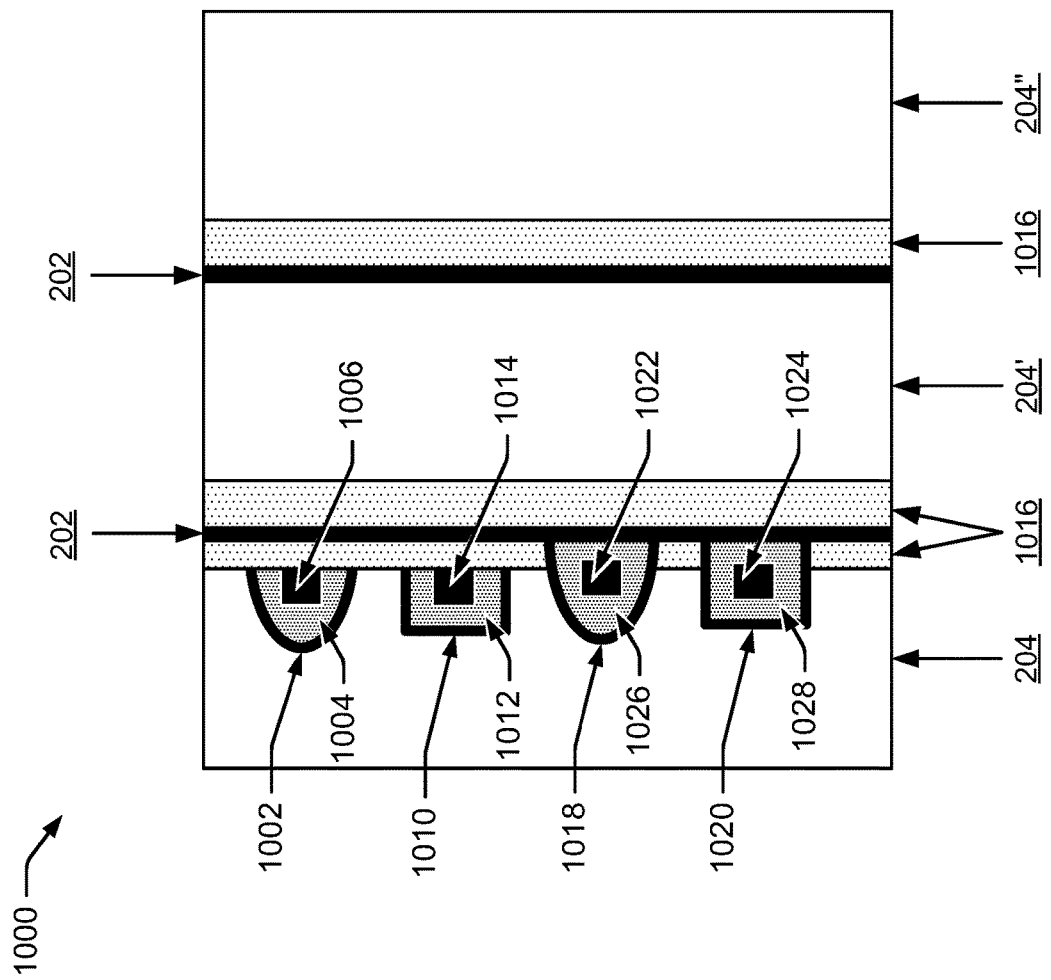
FIG. 10 is a diagram of example coaxial conductive traces for making RF filter elements.

FIG. 10 shows cross-sectional profiles of coaxial options 1000 and respective placement configurations for the conductive traces 202 that form the RF filter elements. For some types of RF filter elements, the example coaxial options 1000 allow easy access to an electrical ground that follows the course of the conductive trace 202, rather than having to provide an entire ground plane under the conductive trace 202 that must be accessed by vias 500 traversing a layer of substrate 204.

Three layers of substrate 204 & 204' & 204" are shown in FIG. 3 for context. A first coaxial trace configuration has a first conductive trace 1002 (or 1010) deposited, for example, in a trough of the substrate 204. A dielectric or insulator 1004 (or 1012) is applied (formed, layered, or deposited) over the first conductive trace 1002 (or 1010). The, a second coaxial conductive trace 1006 (or 1014) is placed or formed in or on the insulator 1004 (or 1012), so that the first coaxial conductive trace 1002 and the second coaxial conductive trace 1006 are electrically insulated from each other by the dielectric or insulator 1004. The trough and the coaxial traces 1002 & 1006 may then be surmounted by a layer of dielectric 1008, for example. When a quarter-wavelength stub 504 of an RF element is to be shorted to ground (as in FIG. 5) to make an anti-resonator for the RF element, then trace 1006 only needs to be shorted to trace 1002 through insulator layer 1004 to make the short to ground, instead of having to drill a conductive via all the way through substrate layer 204 to a ground plane (not shown) on the far side of substrate layer 204.

In some implementations, layers of laminating agent 1016, dielectric, or underfill are insulative, and are applied in such a manner that the first coaxial conductive trace 1002 and the second coaxial conductive trace 1006 are each separate conductors from another main or surface conductive trace 202 laid out on the pane of substrate 204.

In an implementation, outer coaxial conductors 1018 (or 1020) are electrically connected to the main or surface conductive trace 202 in or on the pane of substrate 204. Inner coaxial conductive traces 1022 & 1024 may be surrounded or enclosed by the dielectric or insulation 1026 & 1028, and also surrounded by the outer coaxial conductors 1018 & 1020. The outer coaxial conductors 1018 & 1020 and the conductive trace 202 may shield and contain interference generated by inner coaxial conductive traces 1022 & 1024, or may shield the inner coaxial conductive traces 1022 & 1024 from outside interference, especially when the conductive trace 202 and the outer coaxial conductors 1018 & 1020 are all connected to a common electrical ground.

A cross-section of the coaxial conductive traces 1002 & 1018 shows these mounded, or placed in a rounded trough on the pane of substrate 204, while other coaxial conductive traces 1010 & 1020 may have a square or rectangular cross-section in or on the pane of substrate 204. The cross-section of the coaxial conductive traces can have numerous cross-sectional profiles, such as rectangular, square, semicircular, oval, round, contoured, triangular, and trapezoidal, for example.

Figure 11:
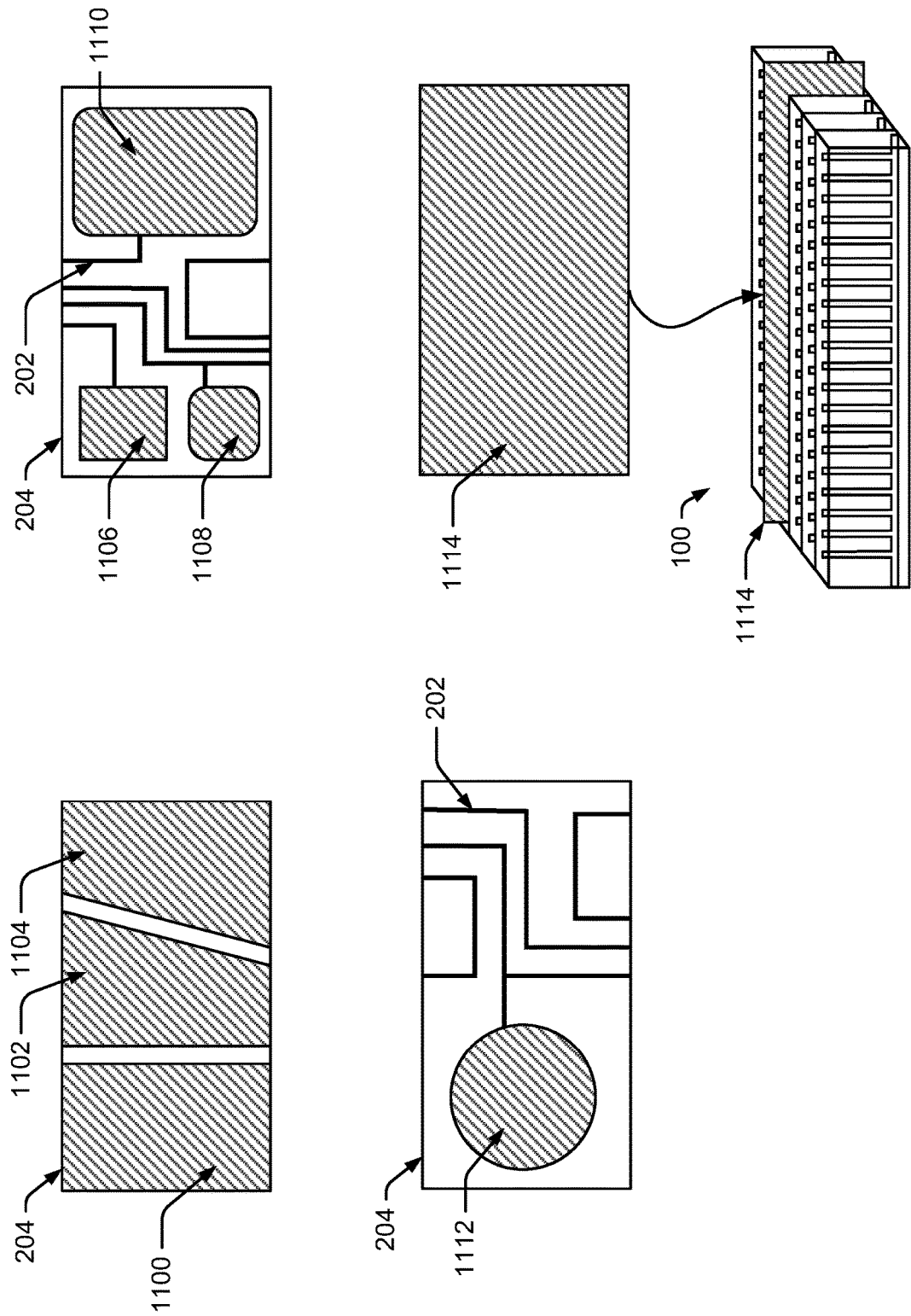
FIG. 11 is a diagram of example ground planes deposited on substrates to be laminated into a stack.

FIG. 11 shows example RF filter layer with one or more conductive ground planes 1100 on at least one of the substrates 204. A ground plane 1100 may be used in conjunction with at least one of the RF filter elements 202 (see for example, 506 in FIG. 5, and FIG. 9). A ground plane 1100 may be used underneath or behind the RF filter element 202, when a feature of the RF filter 202 is to be short-circuited to ground. In some designs of the RF filter elements 202, one or more stub extensions 206 & 208 of an RF filter element 202 on a first layer of the laminated stack 100 may be connected (short-circuited) to an electrical ground on the same layer of the laminated stack 100 or on a second layer of the laminated stack 100, either by a connection on the outer surface of the RF filter package 100, or by using through-substrate vias 500 & 502 (FIG. 5) to make the grounding connections.

The conductive traces 202 on at least one of the panes of substrate 204 include or comprise a conductive plate, conductive pad, or conductive plane, such as a metal plane 1100, layer, film, or sheet. As shown in FIG. 11, the metal plane 1100 may be partial 1100 & 1102 & 1104, covering only part of a pane of substrate 204, or may have multiple different configurations and functions 1106 & 1108 & 1110 on the same pane 204, may provide a desired configuration 1112 on the pane 204 while sharing the pane 204 with other conductive traces 202, or may be a full sheet metal plane 1114, occupying an entire surface area of a pane of substrate 204.

A full metal plane 1114 or a partial metal plane 1100 & 1102 & 1104, may provide an electrical power plane or an electrical ground plane, even on a shared pane 204. The metal plane 1114 may also provide all or part of a radio frequency (RF) shield, or all or part of a Faraday cage, heat sink, or heat spreader.

In an implementation, the metal planes 1100 can be divided into multiple small plane sections 1100 & 1102 & 1104 of power and ground. These metal planes 1100 do not exclude having trace-vias 202 or RF filter elements laterally in between. The metal planes 1100 can also be connected by through-substrate-vias 500 across the substrate layers. Ground or power planes 1100 & 1102 & 1104 can be assembled in a multilayer fashion. Multiple full metal planes 1114 or partial metal planes, such as multiple instances of metal plane 1112, for example, can be placed between multiple laminate layers to form an onboard plane capacitor within the body of the RF filter package 100.

Figure 12:
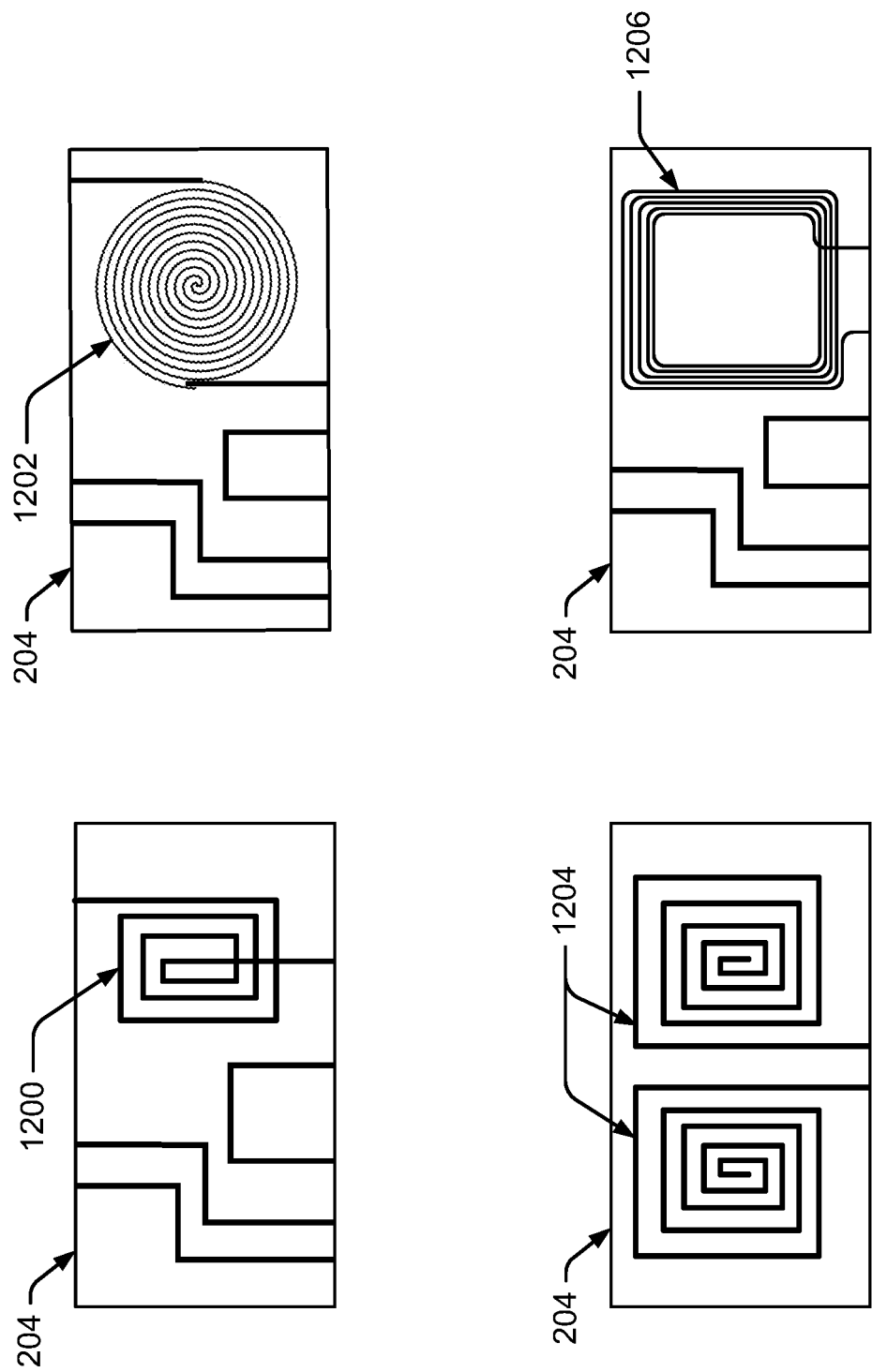
FIG. 12 is a diagram of example electronic components formed from deposited conductive traces.

FIG. 12 shows example electronic components deposited from at least one conductive trace 202 on one of the plurality of substrates 204 in an RF filter package 100. The additional conductive trace 202 can provide hardware on a substrate 204, including a metal plane providing a full ground plane, a metal plane providing a partial ground plane, a metal plane providing a full power plane, a metal plane providing a partial power plane, a coupler, a via-less interconnect, a transformer, a resonator, a resistor, a radio frequency (RF) shield, at least part of a Faraday cage, a heat sink, a heat spreader, and at least a plate of a capacitor, an inductor or coil 1200, an electromagnetic or flat RF coil 1202, a sensor, an RFID tag, an antenna 1204 for UHF, VHF, or Wi-Fi, a vertical dipole antenna, or a charge-receiving inductance coil 1206. The embedded conductive trace 202 may be formed to provide other electronic components.

Figure 13:
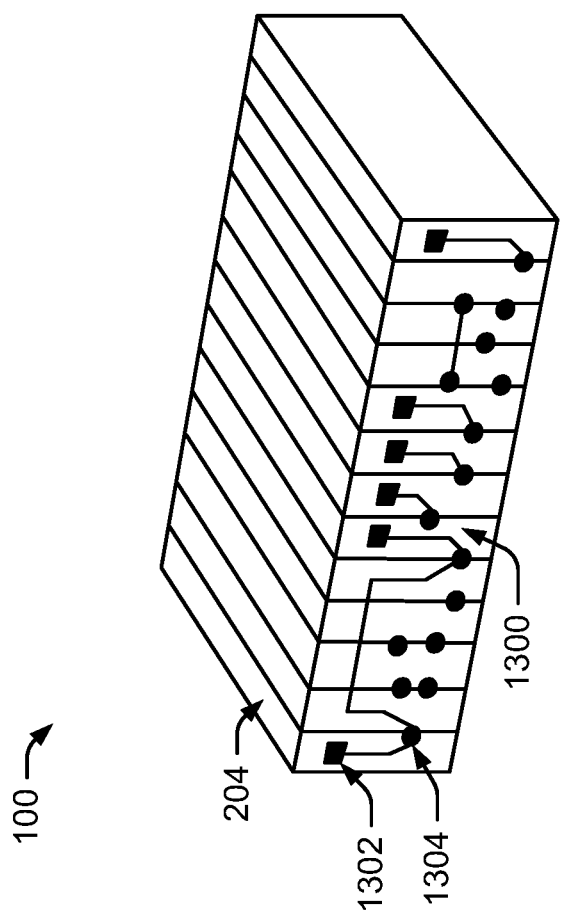
FIG. 13 is a diagram of an example redistribution layer (RDL) deposited on a side of an example laminated RF filter package.

FIG. 13 shows an example redistribution layer (RDL) 1300 deposited on a side of the example RF filter package 100 to make electrical connections for internal elements within the example RF filter package 100, such as the example RF filter elements 202, and to make external connections with external boards and components outside the example RF filter package 100. For example, additional hardware may be externally connected to the redistribution layer 1300, including one or more of an active semiconductor chip, a passive semiconductor device, an interposer, a substrate, a bump, and a pad. To these additions, or to the RDL 1300 itself, may be connected discrete additional electronic components, such as active and passive electronic components, chips, dies, inductors, capacitors, resistors, shunts, transformers, and so forth. An example redistribution layer 1300 makes the conductive ends 304 (FIG. 3) of the conductive traces 202 accessible for further connection through larger contact pads, bonding pads 1302, bump balls 1304, and so forth.

Figure 14:
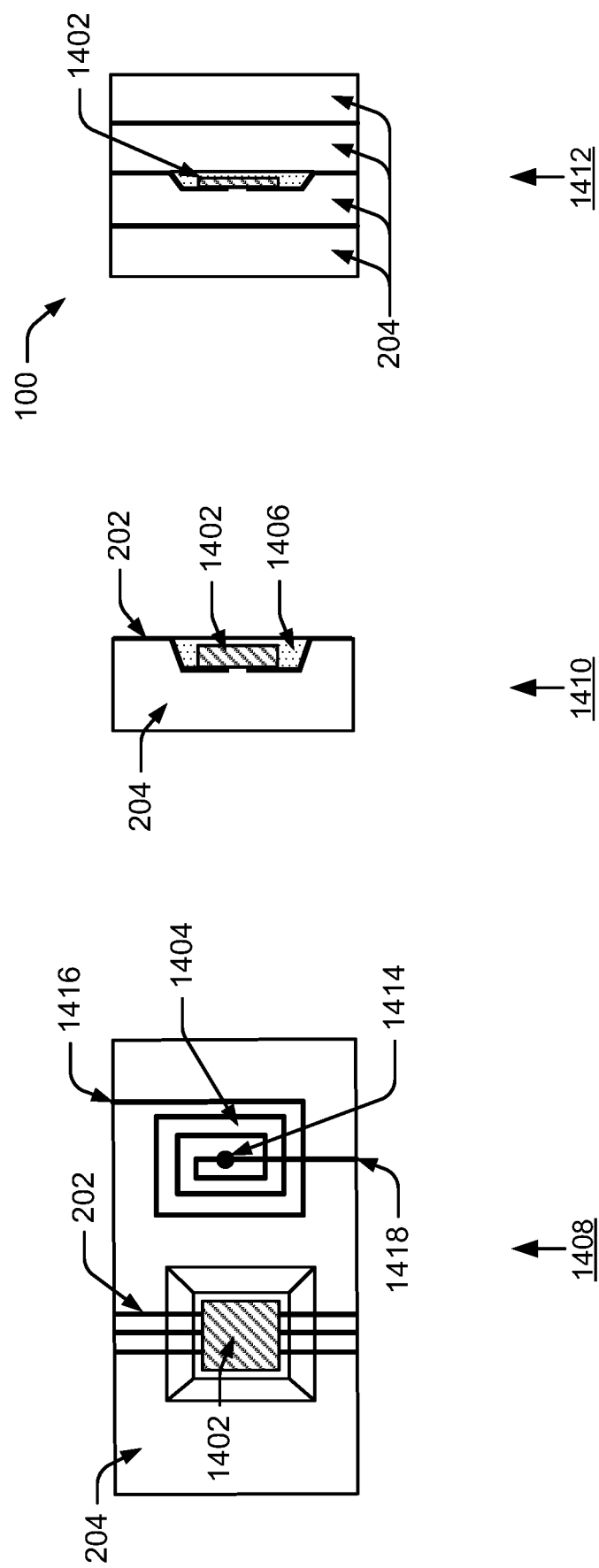
FIG. 14 is a diagram of example active or passive components on or within a layer of a laminated stack for embedding within a laminated RF filter package.

FIG. 14 shows an example RF filter package 100 in which active chips or passive electronic devices are embedded within or between laminate substrate layers 204 during the stacking process. The surface of the substrate 204 may be recessed, for example, to accommodate respective electronic components 1402 & 1404, such as dies, chips, or passive components. The recesses may be filled-in with an insulating material 1406 or a dielectric, or the recesses may be filled in with a laminating material or laminating layer during the stacking and laminating processes. The recesses may also be left as air or gas spaces, as some gases and air have inherent insulating and dielectric properties.

View 1408 in FIG. 14 shows the example embedded electronic components 1402 & 1404 and conductive traces 202 as if facing the "front" flat surface of a pane of substrate 204. View 1410 shows the example embedded electronic component 1402 recessed in the pane of substrate 204 and conductive traces 202, from a side view. Likewise, view 1412 shows the example embedded electronic component 1402 recessed in the pane of substrate 204 and conductive traces 202, from a side view, in the context of a laminated stack of substrates 204 in an example RF filter package 100.

In an implementation, an electronic component 1402 or 1404, such as a die, chip, or passive device can be mounted on the conductive traces 202 and embedded between two substrate layers by a laminating layer, without recessing the devices into the surface of the substrate 204.

FIG. 14 also shows example connection options for an embedded component 1402. For example through-substrate-via 1414 can connect to a redistribution layer (1300 FIG. 13), where conductive end 1416, and a conductive end of through-silicon-via 1414, are on the same side of the pane of substrate 204, or where conductive end 1418, and a conductive end of through-silicon-via 1414, are on the same side of the pane of substrate 204.

Alternatively, through-silicon-via 1414 can connect to a backside of the substrate 204, where conductive end 1416, and a conductive end of through-silicon-via 1414, are on opposite sides of the pane of substrate 204, or where conductive end 1418, and a conductive end of through-silicon-via 1414, are on opposite sides of the pane of substrate 204. A pad can also be embedded in the plurality of substrates 204, the embedding including creating a through-substrate-via 500 through at least part of a thickness of one of the substrates 204, and revealing the pad when slicing to create a side surface of the stack comprising the RF filter package 100, the side surface revealing a conductive end of a conductive trace of each parallel plane of the plurality of substrates 204.

Figure 15:
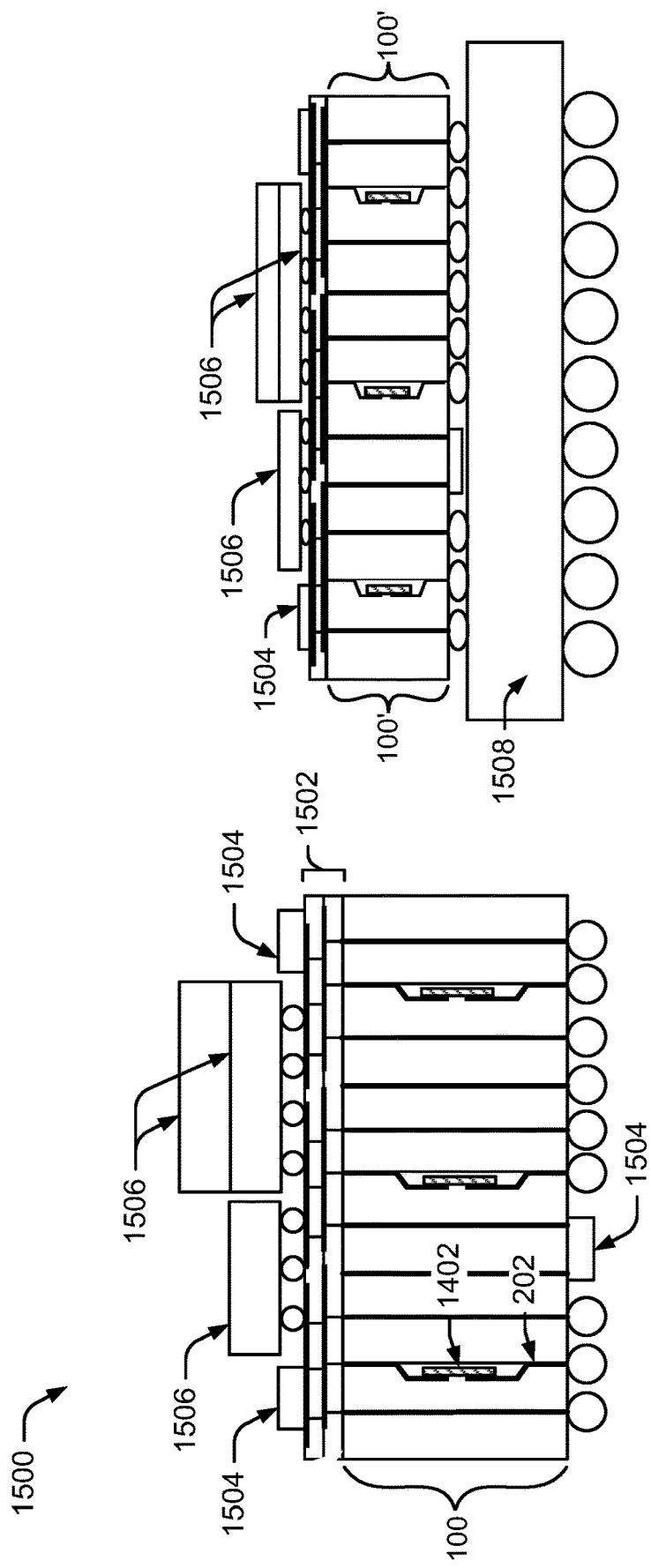
FIG. 15 is a diagram of an example RF filter assembly with redistribution layers and internal and external components added.

FIG. 15 shows example connection of additional hardware pieces to an example RF filter package 100. The added hardware piece can be an electrical or electronic component, such as a connector, solder, solder balls, contact pads, a passive electronic device, an active electronic device, an inductor, capacitor, resistor, transformer, a shunt, a chip, a die, and so forth. The added hardware piece may also be a non-electronic entity such as a joining material, a polymer cover for encasement strength, an insulator, dielectric, and so forth.

In FIG. 15, the example RF filter package 100 is part of an electronic assembly 1500 conductively connected to embedded active components 1402, and may be connected to embedded passive components too. The example electronic assembly 1500 may be connected through redistribution layers 1502 and surface mount technology (SMT) to surface-mounted passive components 1504 and surface-mounted active components 1506.

The surface-mounted active components 1506 and passive components 1504, such as dies and chips, can be mounted on either a lateral sliced side, or a top or bottom side of the example RF filter package 100. The redistribution layers 1502 are preferably on a side where there is access to conductive ends of the internal RF filter elements 202.

An example RF filter package 100' may in turn be assembled to a package substrate 1508 or mounted directly to a board, for example mounted to a motherboard with the RF filter elements 202 in a plane at an angle perpendicular to the plane of the motherboard, to save space. The conductive interconnections between surface-mounted active and passive components 1506 & 1504, respectively, and the package substrate 1508, may go through conductive traces 202 in the RF filter package 100. Conduction paths may also go through the package substrate 1508, when the package substrate 1508 is an interposer.

Figure 16:
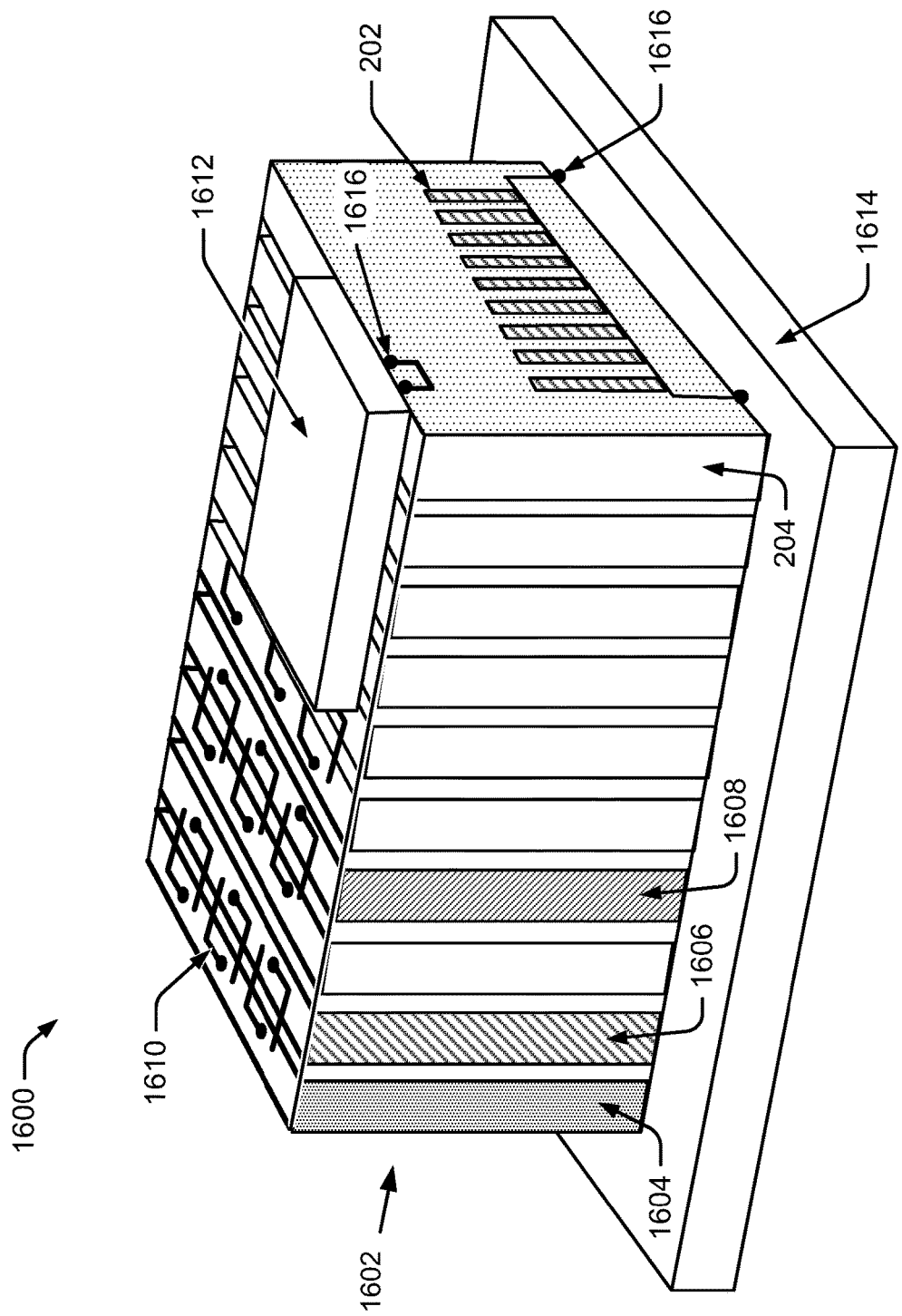
FIG. 16 is a diagram of an example RF filter assembly with active component layers in a laminated stack to make a self-contained device.

FIG. 16 shows an example RF filter package 1600 in which the laminated stack 1602 of layers in the RF filter package 100 includes one or more active processing layers 1604 & 1606 & 1608, such as an integrated circuit die or dies as one or more of the layers, or within one or more of the layers 1602. That is, one or more layers of the stack 1602 may be implemented with integrated circuit electronics, or as an IC die (chip) instead of being a passive substrate 204 with a conductive trace 202 deposited on the passive substrate 204. The individual chips 1604 & 1606 & 1608 employed as laminate layers may be, for example and without limitation, memory chips, such as DRAM, SRAM, flash memory, and so forth, and/or logic chips. In an implementation, electronics or circuitry supportive of the RF filtering function of the RF filter elements 202 may be implemented by one or more chip layers in the stack 1602. In an implementation, the RF filter package 1600 itself is a complete device or complete system, such as a complete RF transmitter or receiver.

A redistribution layer (RDL) 1610 may be disposed on the top or bottom of the stack 1602 as shown, thus permitting an active semiconductor chip 1612, passive device, or even heat spreader to be mounted to the stack bottom and/or top. Alternatively, an interposer 1614 may be mounted to the top and/or bottom of the stack 1602. Also, bumps 1616 or pads on the top and/or bottom of the stack 1602 permit the stack 1602 to be connected to the interposer 1614, other substrate, and/or active chip, passive device, or heat spreader.

Figure 17:
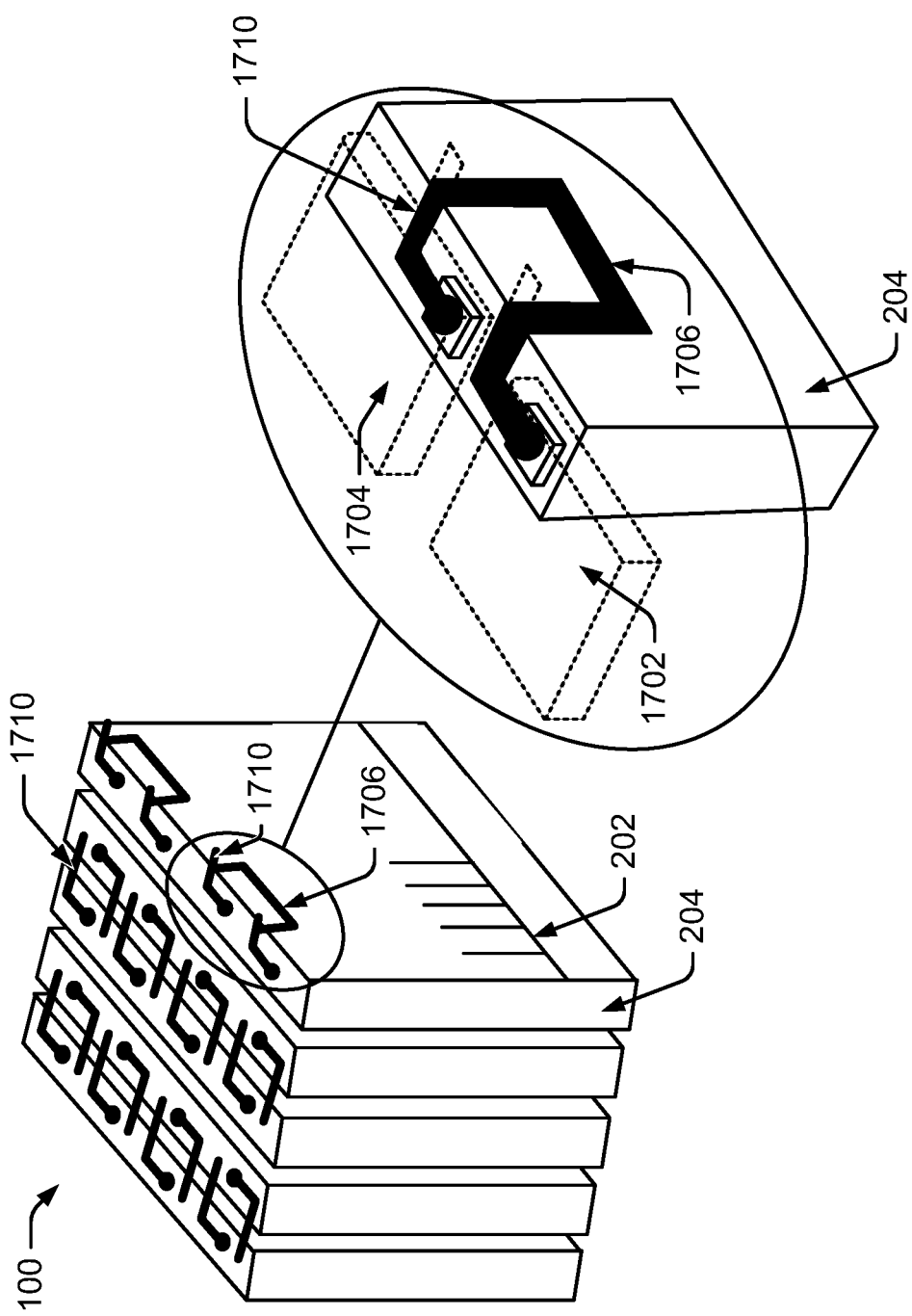
FIG. 17 is a diagram of an example RF filter package with conductive trace interconnects between laminations to connect external dies or chips.

FIG. 17 shows an example RF filter package 100 in which two or more chips 1702 & 1704 are electrically coupled together through a conductive trace 1706 that serves as a surface-to-same-surface interconnect 1706 that has been deposited on a pane of substrate 204 in the stack of layers of the RF filter package 100. Conductors of a redistribution layer 1710 may intervene between the conductive trace 1706 of the RF filter package 100 and the active surface-mounted chips 1702 & 1704, forming "T" junctions with the conductive traces 1706 across adjacent vertical layers 204 of the RF filter package 100. Conventional trace width and lead spacing, such as 50 micron or 30 micron lines/spaces or vias with ⅕ or smaller lines/spacing, make conventional electrical performance and manufacturability of such mounted chips 1702 & 1704 a challenge. Because the conductive trace 1706 of the example RF filter package 100 has significantly more relaxed width and spacing requirements compared to existing conventional solutions, the example conductive traces 1706 of the RF filter package 100 can provide wider traces 1706 with higher electrical capacity than conventional, thereby increasing performance and making such a package 100 easier to manufacture.

Figure 18:
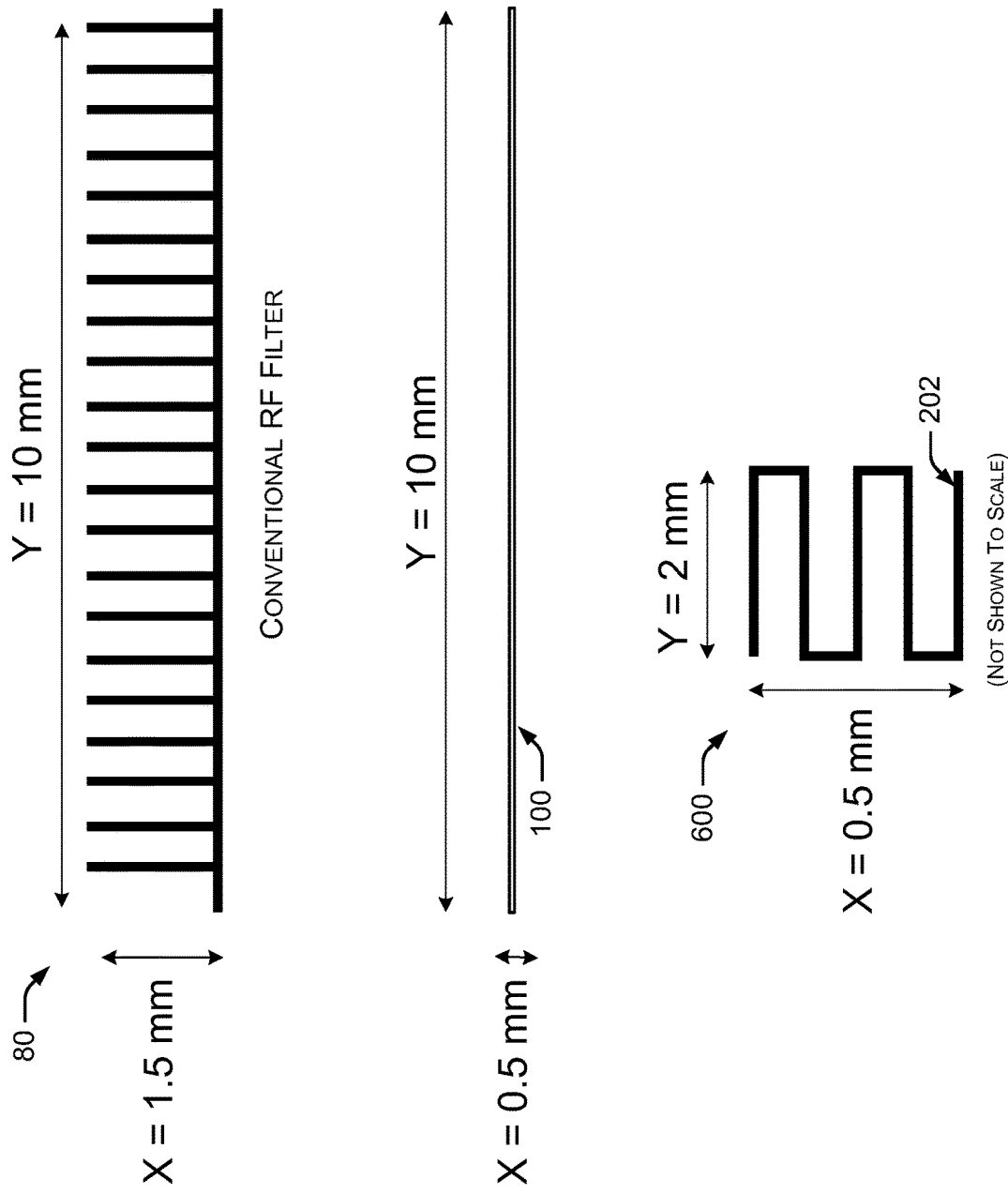
FIG. 18 is a diagram of example space reduction provided by example RF filter packages compared with conventional RF filters on a motherboard.

FIG. 18 is a diagram of example space reduction on a motherboard provided by example RF filter packages 100 & 600 compared with conventional RF filters 80. A conventional RF filter 80 has a Y dimension of 10 millimeters (mm) and an X dimension of 1.5 mm. For comparison, an example RF filter package 100 laminated with deposited conductive traces 202 that form stub RF filter elements 202 has a Y dimension of 10 mm and an X dimension of 0.05 mm. The example RF filter package 100 provides a mathematical reduction in the X dimension of thirty times (30X). Thus, the example RF filter package 100 has an X dimension that is only ¹⁄₃₀ the magnitude of the X dimension of a conventional RF filter 80.

Likewise, an example RF filter package 600 laminated with deposited conductive traces 202 that form folded or serpentine stub RF filter elements 202, or laminated RF filter elements 202 connected in series, has a Y dimension of 2 mm and an X dimension of 0.5 mm. The example RF filter package 600 provides a mathematical reduction in the X dimension of three times (3X), and a mathematical reduction in the Y dimension of five times (5X). Thus, the example RF filter package 600 has an X dimension that is only ⅓ the magnitude of the X dimension of a conventional RF filter 80, and a Y dimension that is only ⅕ the magnitude of the Y dimension of a conventional RF filter 80.

Example Methods

Figure 19:
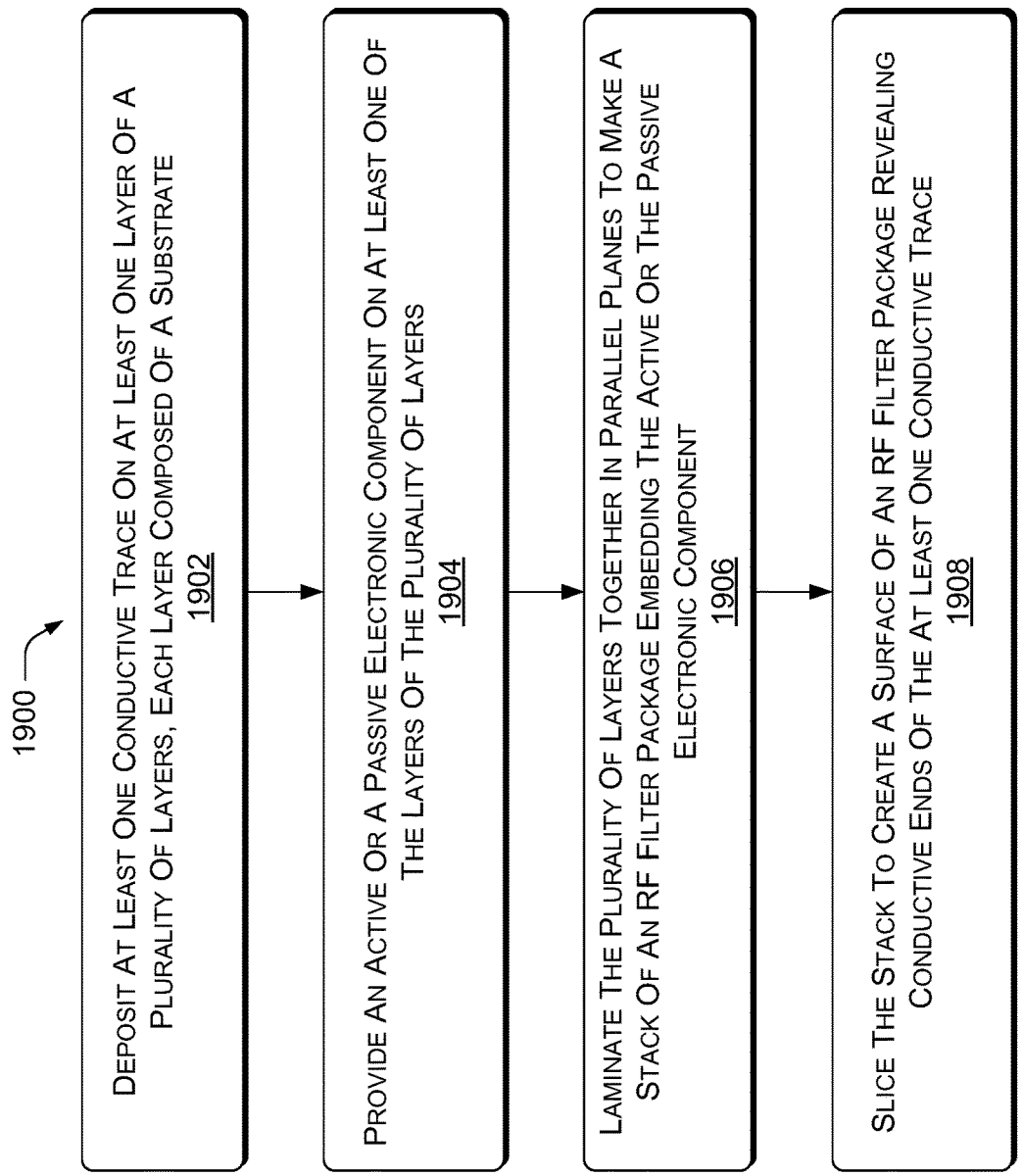
FIG. 19 is a flow diagram of an example method of embedding an active device in a laminated RF filter package.

FIG. 19 shows an example method 1900 of embedding an active or a passive component in or on a layer of a laminated stack for an RF filter package 100. In the flow diagram of FIG. 19, the operations of the example method 1900 are shown in individual blocks.

At block 1902, at least one conductive trace is deposited on at least one layer of a plurality of layers, each layer composed of a substrate.

At block 1904, an active or a passive electronic component is provided on at least one of the layers of the plurality of layers.

At block 1906, the plurality of layers is laminated together in parallel planes to make a stack of an RF filter package embedding the active or the passive electronic component.

At block 1908, the stack is sliced to create a surface of an RF filter package revealing conductive ends of the at least one conductive trace.

Figure 20:
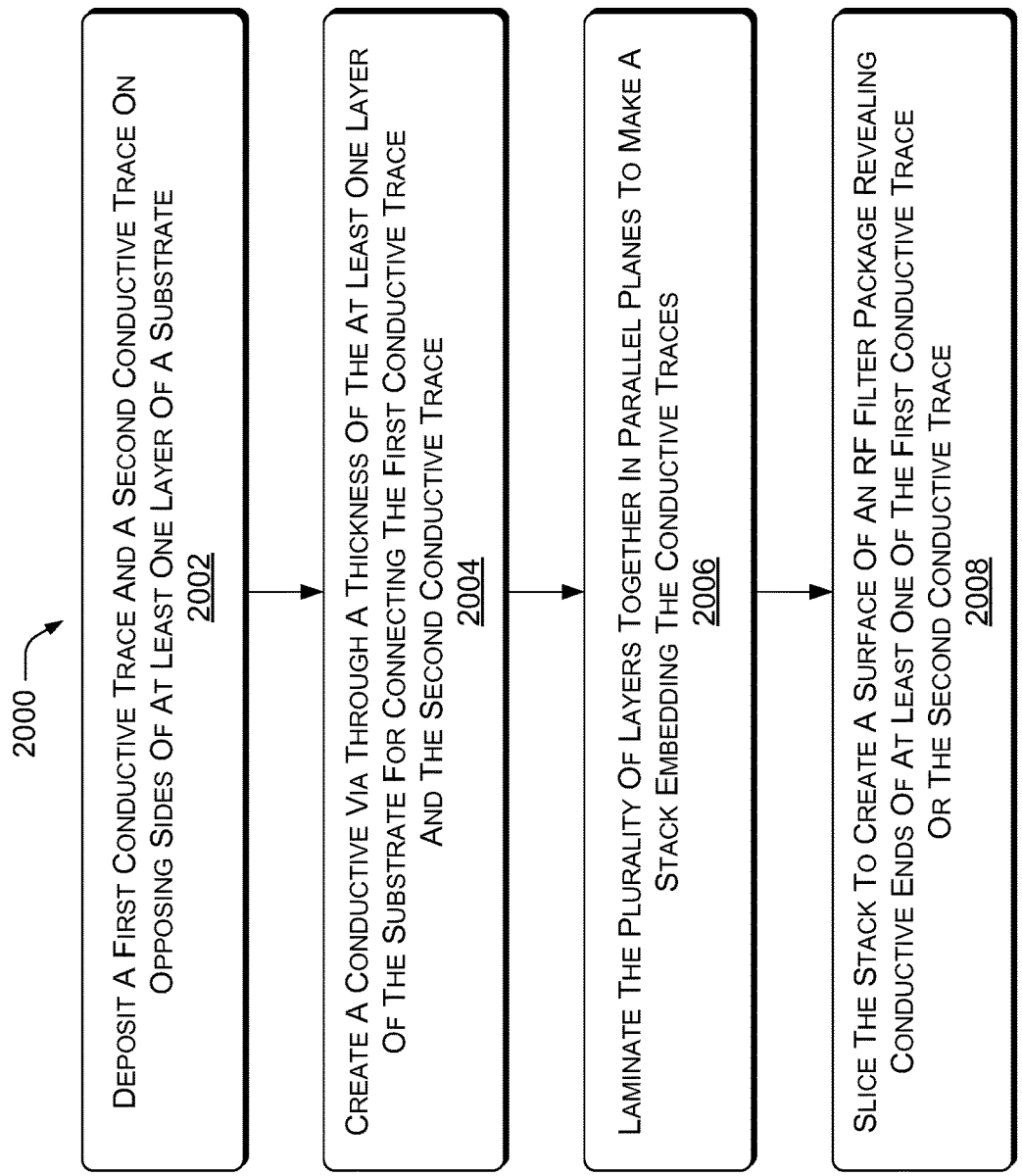
FIG. 20 is a flow diagram of an example method of creating through-substrate vias to connect conductive traces forming RF filter elements on different layers of a laminated RF filter package.

FIG. 20 shows an example method 2000 of creating a conductive via through a thickness of a layer of a laminated stack of an RF filter package to connect conductors and RF filter elements of different layers. In the flow diagram of FIG. 20, the operations of the example method 2000 are shown in individual blocks.

At block 2002, a first conductive trace and a second conductive trace are deposited on opposing sides of at least one layer of a substrate.

At block 2004, a conductive via is created through a thickness of the at least one layer of the substrate for connecting the first conductive trace and the second conductive trace.

At block 2006, the plurality of layers is laminated together in parallel planes to make a stack embedding the conductive traces.

At block 2008, the stack is sliced to create a surface of an RF filter package revealing conductive ends of at least one of the first conductive trace and the second conductive trace.

Wirebond (Bondwire) and Bond Via Array (BVA) Embodiments

Figure 21:
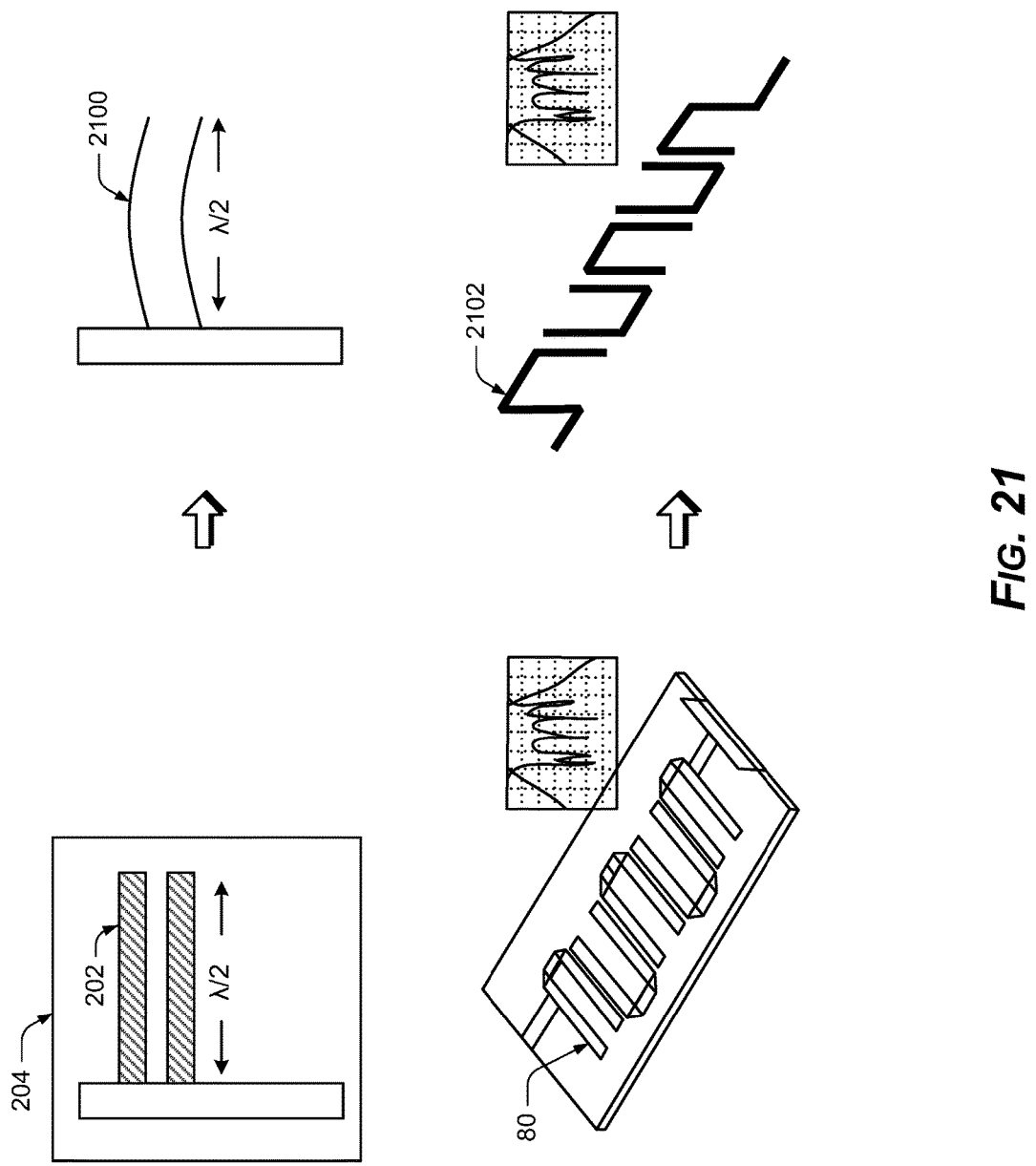
FIG. 21 is a diagram of an example wirebond RF filter element.

FIG. 21 shows an example wire RF filter element 2100. A wirebond RF filter element 2100 can provide equivalence of an RF filtering function using wire stubs 2100 instead of stub conductive traces 202 (for example, an RDL deposited layer) that are deposited on a substrate 204, or, instead of microstrip or stripline implementations of an RF filter element 202.

For example, a wirebond hairpin RF filter element 2102 can be made much smaller than a conventional planar microstrip hairpin filter 80, with far fewer materials, and at much lower cost. In an implementation, the wires are formed into the configuration of a distributed element RF filter element 2102, and then encased in a fill material for permanency.

Figure 22:
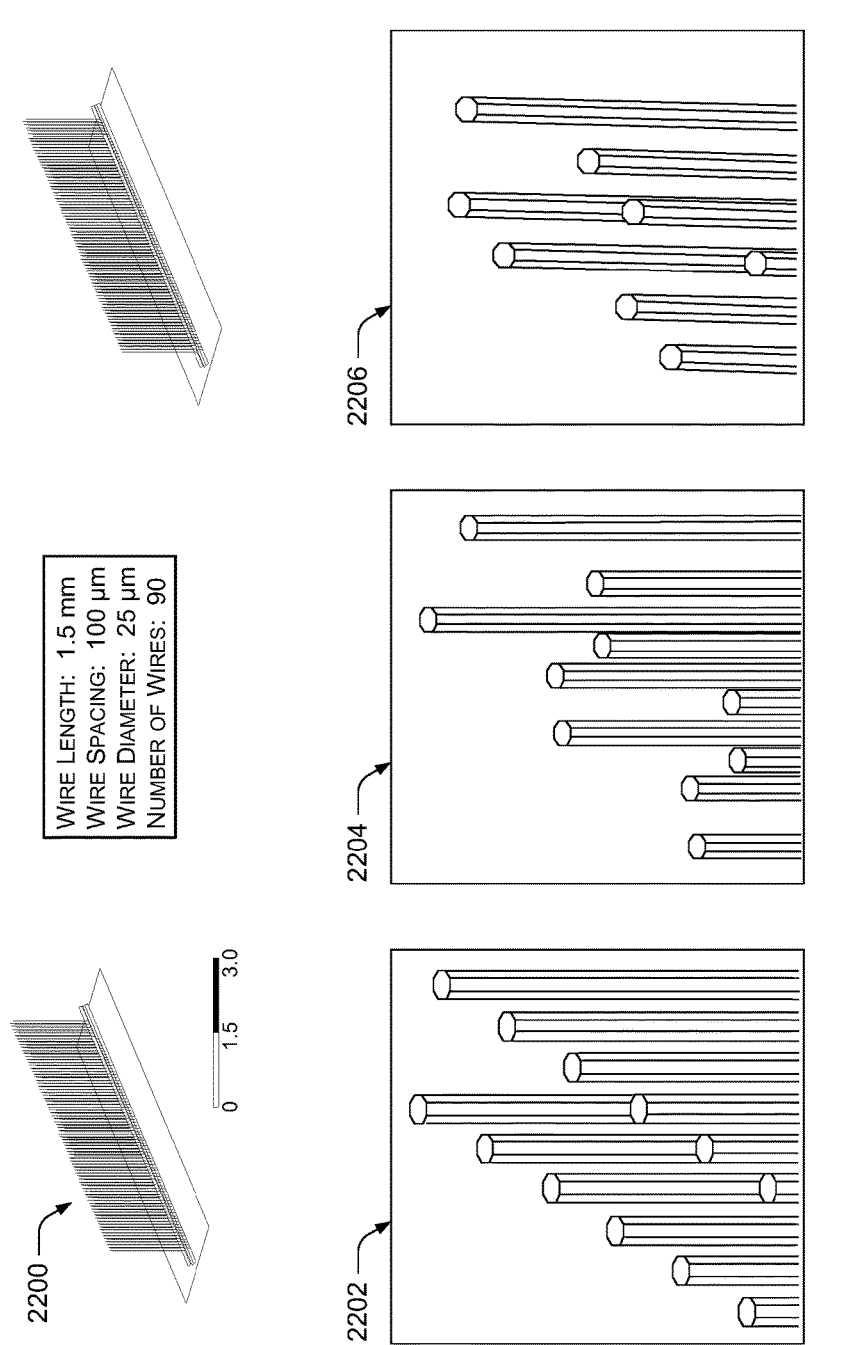
FIG. 22 is a diagram of height variations in wire lengths of example wirebond RF filter elements.

FIG. 22 shows example 3D low pass filters 2200 with different z-height variations, such as no variation in z-height 2202, a first pattern 2204 of wires with +/−40 μm z-height variation, and a second pattern 2206 of wires with +/−40 μm z-height variation. A relative z-height variation of great enough magnitude can provide different RF filtering functions, but if a wire stub length is nominally 1.5 mm, then a z-height variation of +/−40 μm in the wire heights does not appear to impart a significant impact on RF filtering performance.

Figure 23:
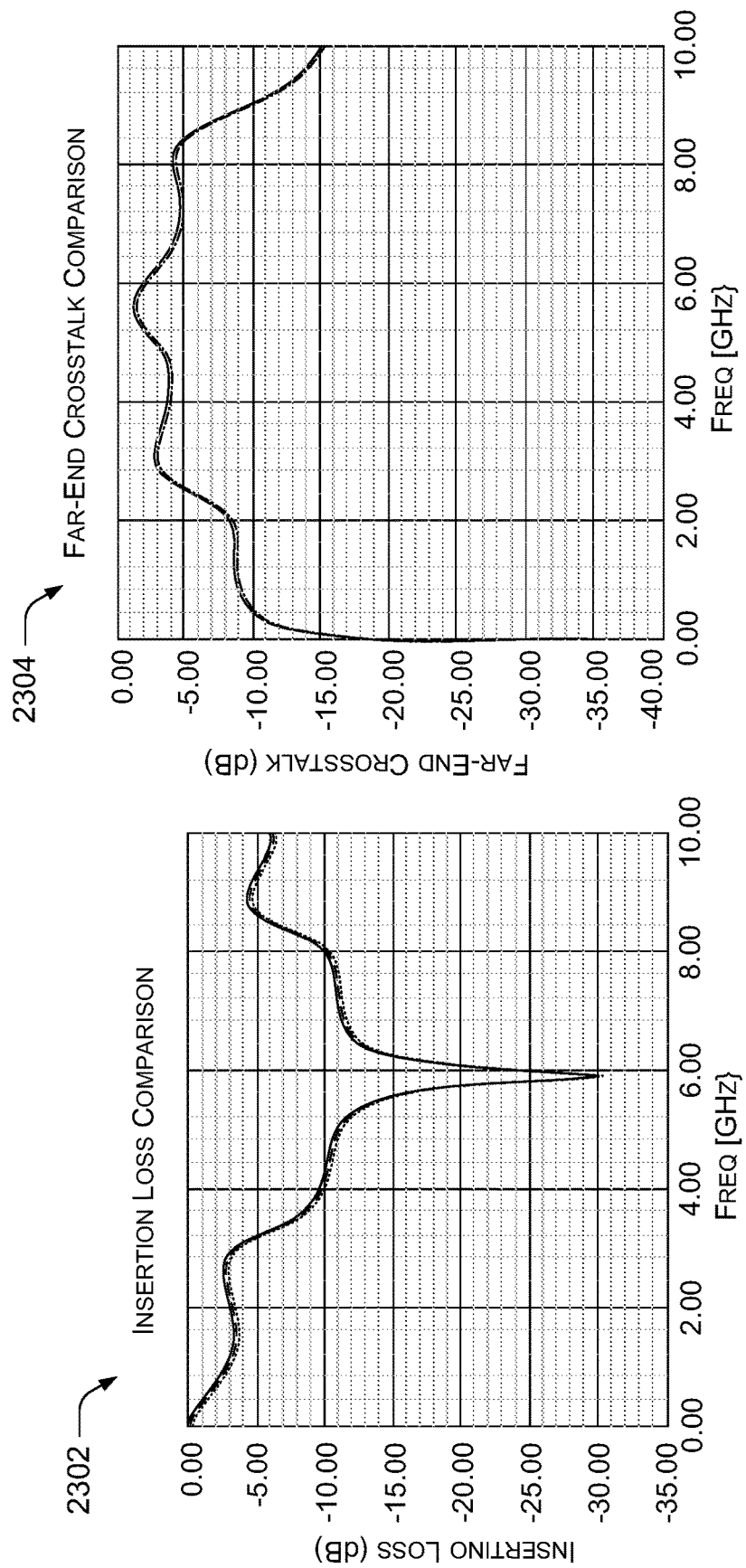
FIG. 23 is a diagram of S-parameter comparisons for the different height variations of the wirebond RF filters of FIG. 22.

FIG. 23 shows S-parameters for different z-height variations of approximately +/−40 μm in a wire stub with a nominal length of 1.5 mm. In an insertion loss comparison 2302, and a far-end crosstalk comparison 2304, wire stub RF filter elements 2202 & 2204 & 2206 with the three z-height variations in FIG. 22 yield almost identical graphs, providing evidence that when the wire stub lengths are nominally 1.5 mm, then a z-height variation of +/−40 μm in the wire lengths does not impart a significant impact on RF filtering performance.

Figure 24:
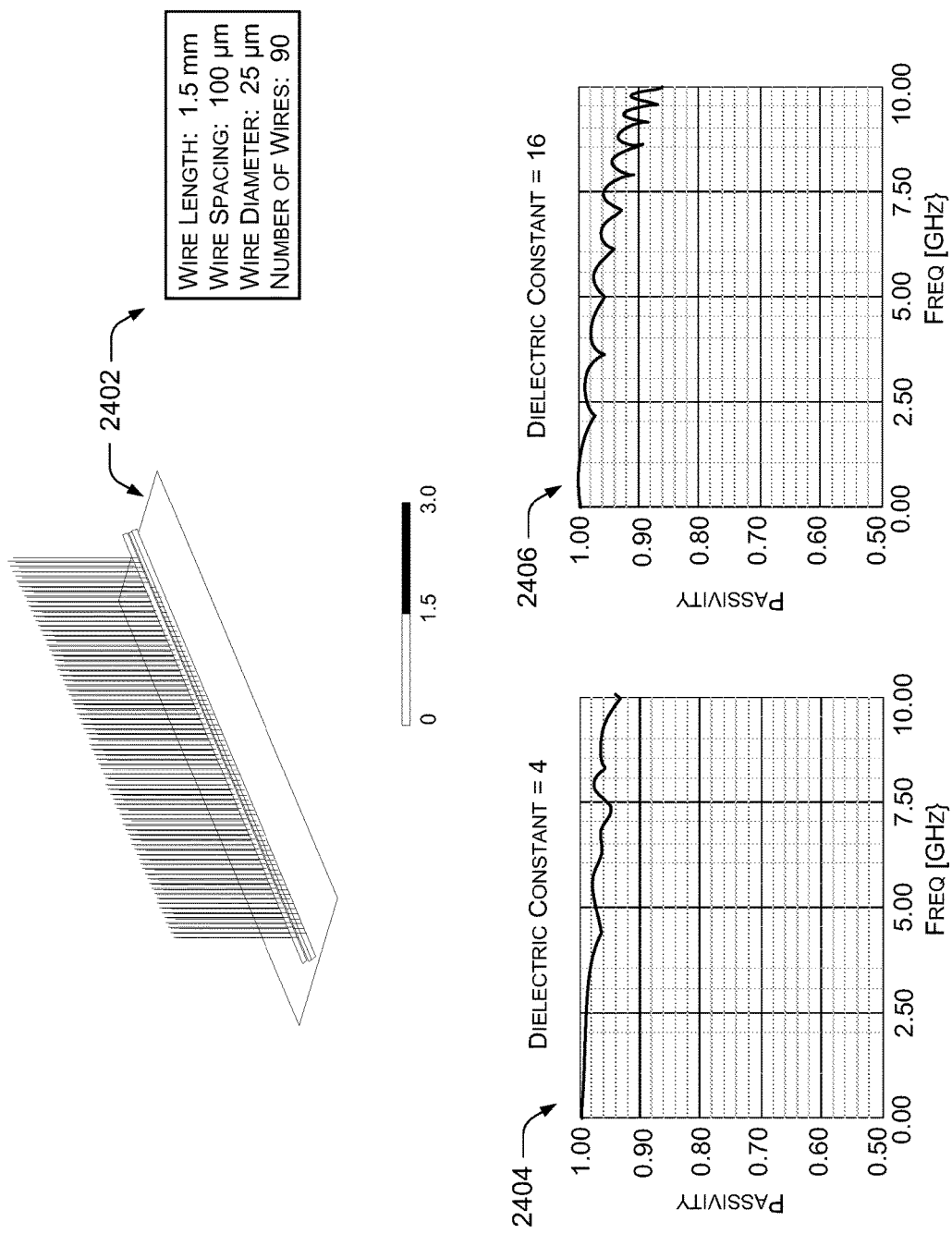
FIG. 24 is a diagram of example passivity (radiation loss) checks with dielectric/conductor loss for a bandpass filter of wirebond RF element design.

FIG. 24 shows example passivity (radiation loss) checks of S-parameters with dielectric/conductor loss (as opposed to without dielectric/conductor loss) for a bandpass filter of wirebond RF element design 2402. Graph 2404 shows passivity versus frequency for a dielectric constant of 4 for the shown bandpass filter 2402. Graph 2406 shows passivity versus frequency for a dielectric constant of 16 for the shown bandpass filter 2402. In this implementation, the passivity values from the vertical wirebond designs are better than 0.95 over a broadband frequency range for RF filter elements 2402 with conductor/dielectric loss. This result indicates that the radiation losses are minimal.

Figure 25:
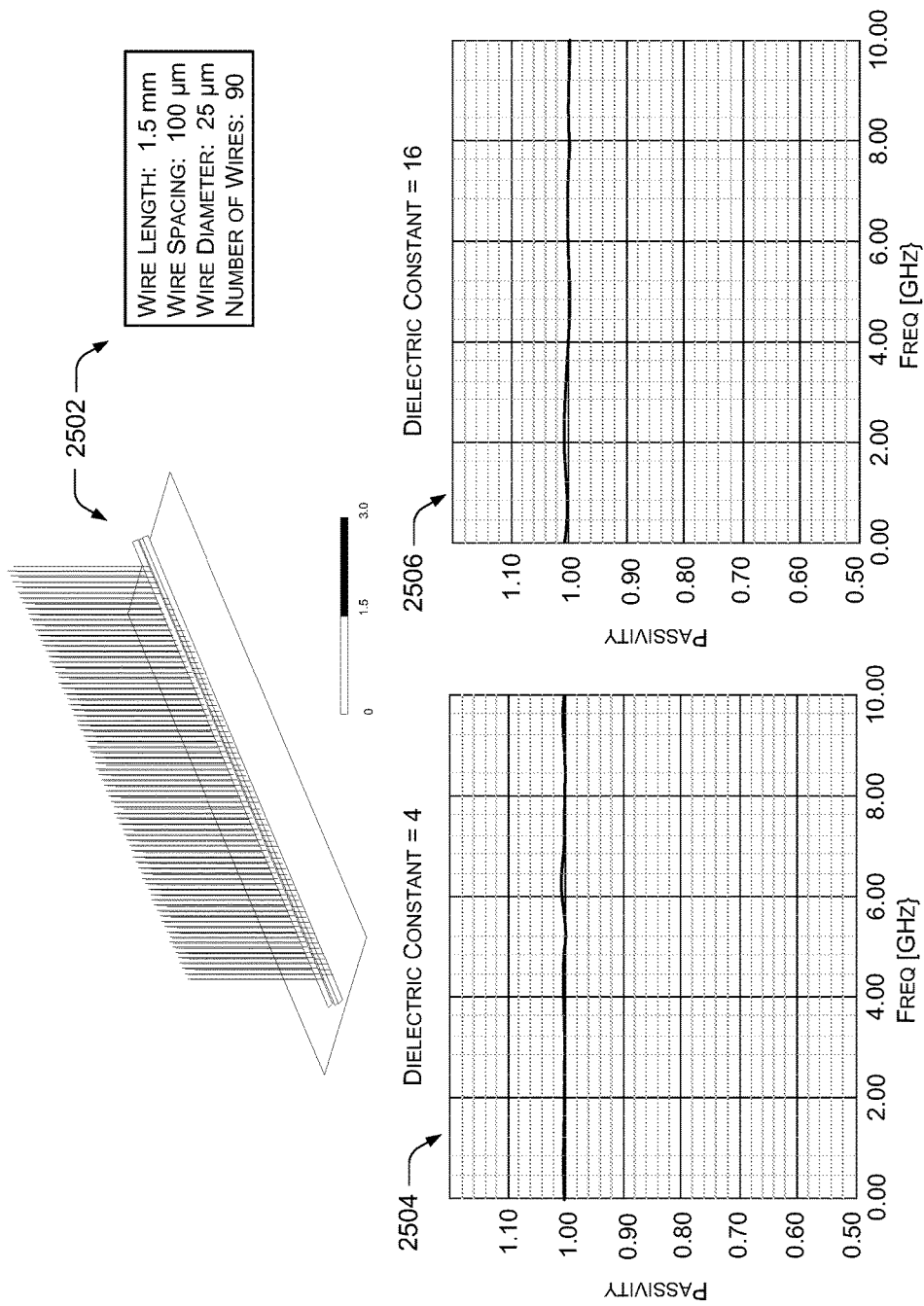
FIG. 25 is a diagram of example passivity (radiation loss) checks without dielectric/conductor loss for the bandpass filter of wirebond RF element design.

FIG. 25 shows example passivity (radiation loss) checks of S-parameters without dielectric/conductor loss (as opposed to with dielectric/conductor loss as in FIG. 24) for a bandpass filter of wirebond RF element design 2502. Graph 2504 shows passivity versus frequency for a dielectric constant of 4 for the shown bandpass filter 2502. Graph 2506 shows passivity versus frequency for a dielectric constant of 16 for the shown bandpass filter 2502. In this implementation, the passivity values from the vertical wirebond designs are better than 0.995 for RF filter elements without conductor/dielectric loss. This result indicates that the radiation losses are negligible, or almost zero.

Figure 26:
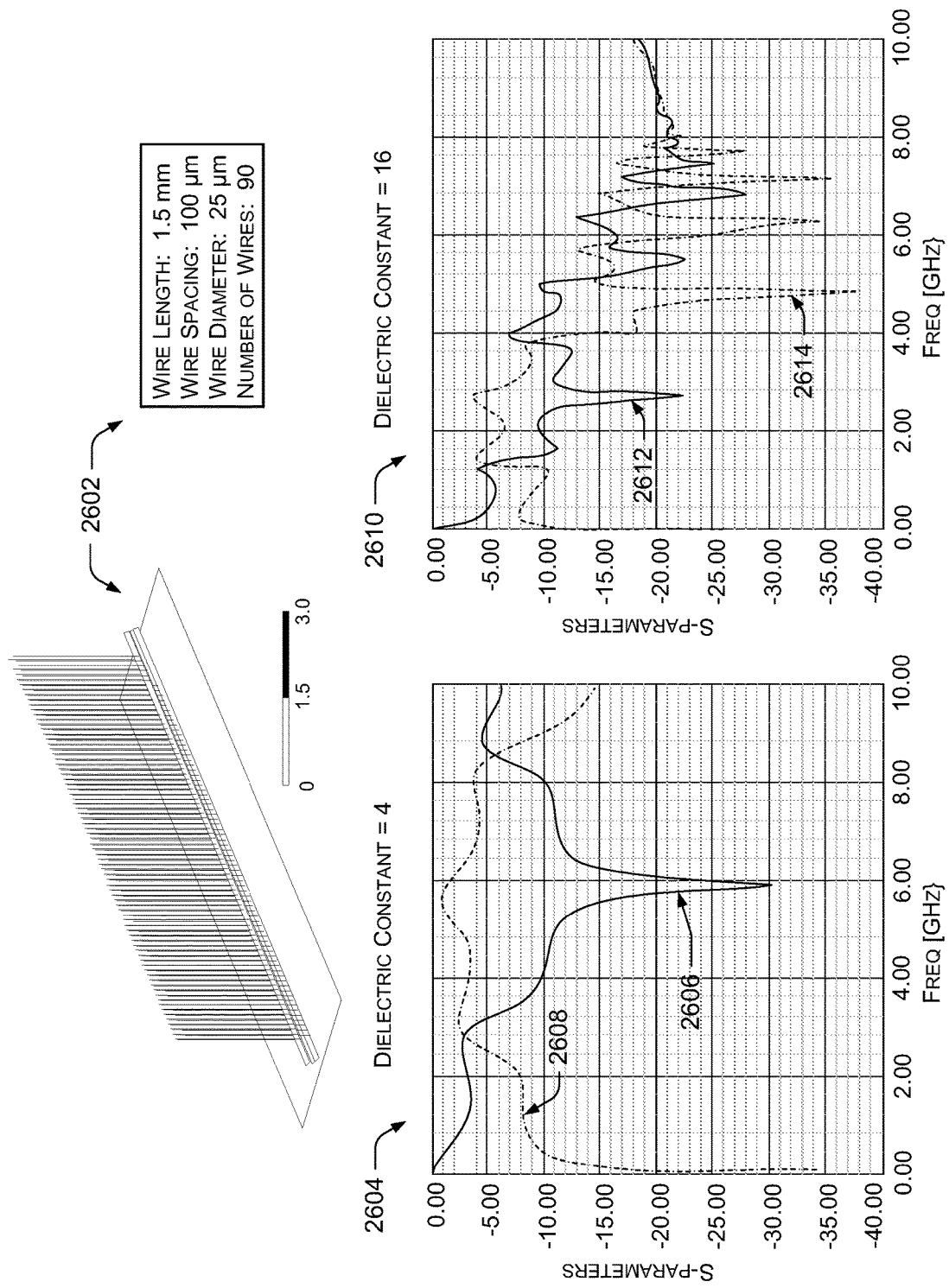
FIG. 26 is a diagram of S-parameters for the wirebond bandpass RF filter.

FIG. 26 shows S-parameters for the shown wirebond bandpass RF filter 2602. Graph 2604 shows S-parameters at a dielectric constant of 4, including insertion loss 2606 and far-end crosstalk 2608. Graph 2610 shows S-parameters at a dielectric constant of 16, including insertion loss 2612 and far-end crosstalk 2614.

Figure 27:
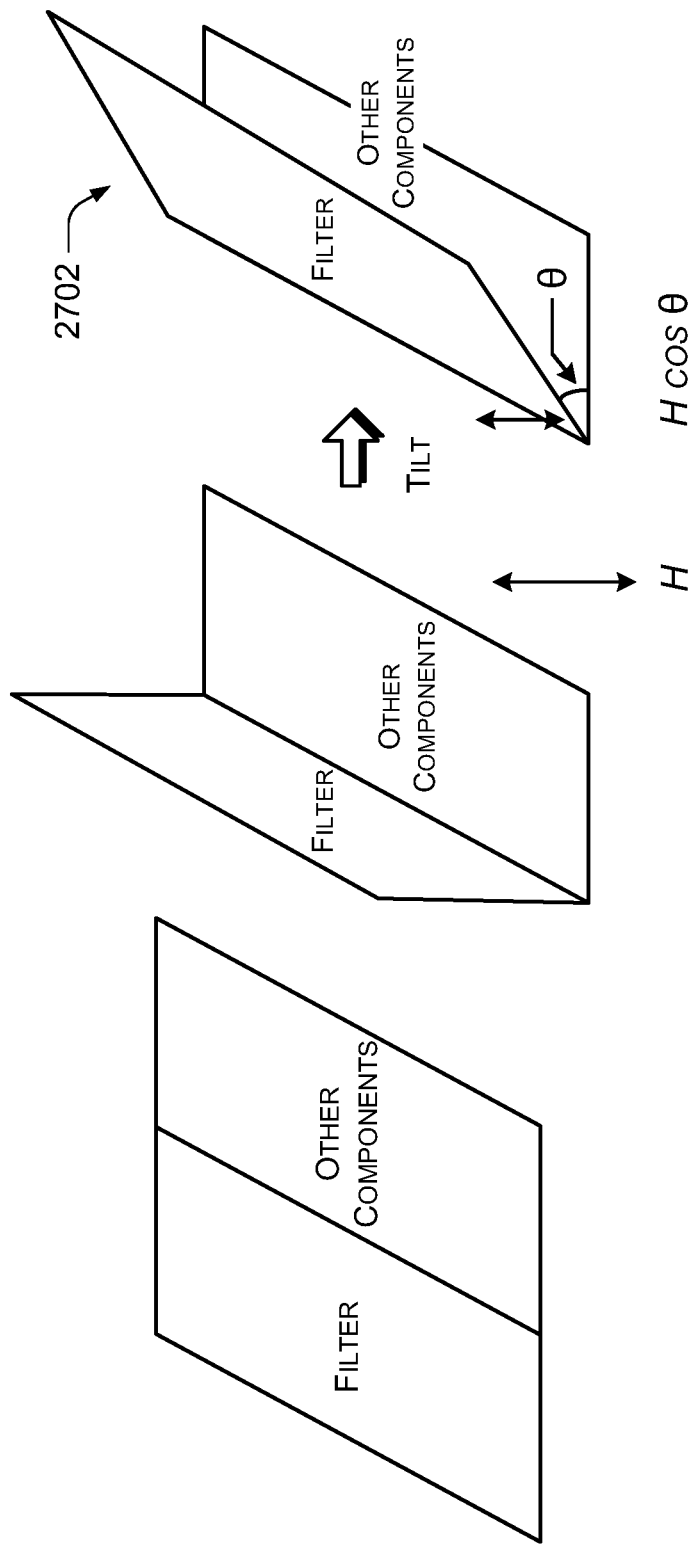
FIG. 27 is a diagram of example tilted RF filter elements with respect to the vertical, for saving area and 3-dimensional space on a motherboard.

FIG. 27 shows example tilted RF filter elements with respect to the vertical, for saving area and 3-dimensional space on a motherboard. The design of an example tilted flip RF filter 2702 as shown in FIG. 27 is to be distinguished from slanted stubs 208 in FIGS. 2 and 918 in FIG. 9, which reduce the height of the RF filter element within a vertical plane that is perpendicular to a horizontal motherboard. The example tilted flip RF filter 2702 saves height and sometimes space by tilting the plane in which the RF filter element 202 is disposed, at an angle θ from horizontal. Thus, the savings in vertical height can be Hcos θ, the nominal vertical height times the fractional value provided by the cosine of the angle of tilt.

Figure 28:
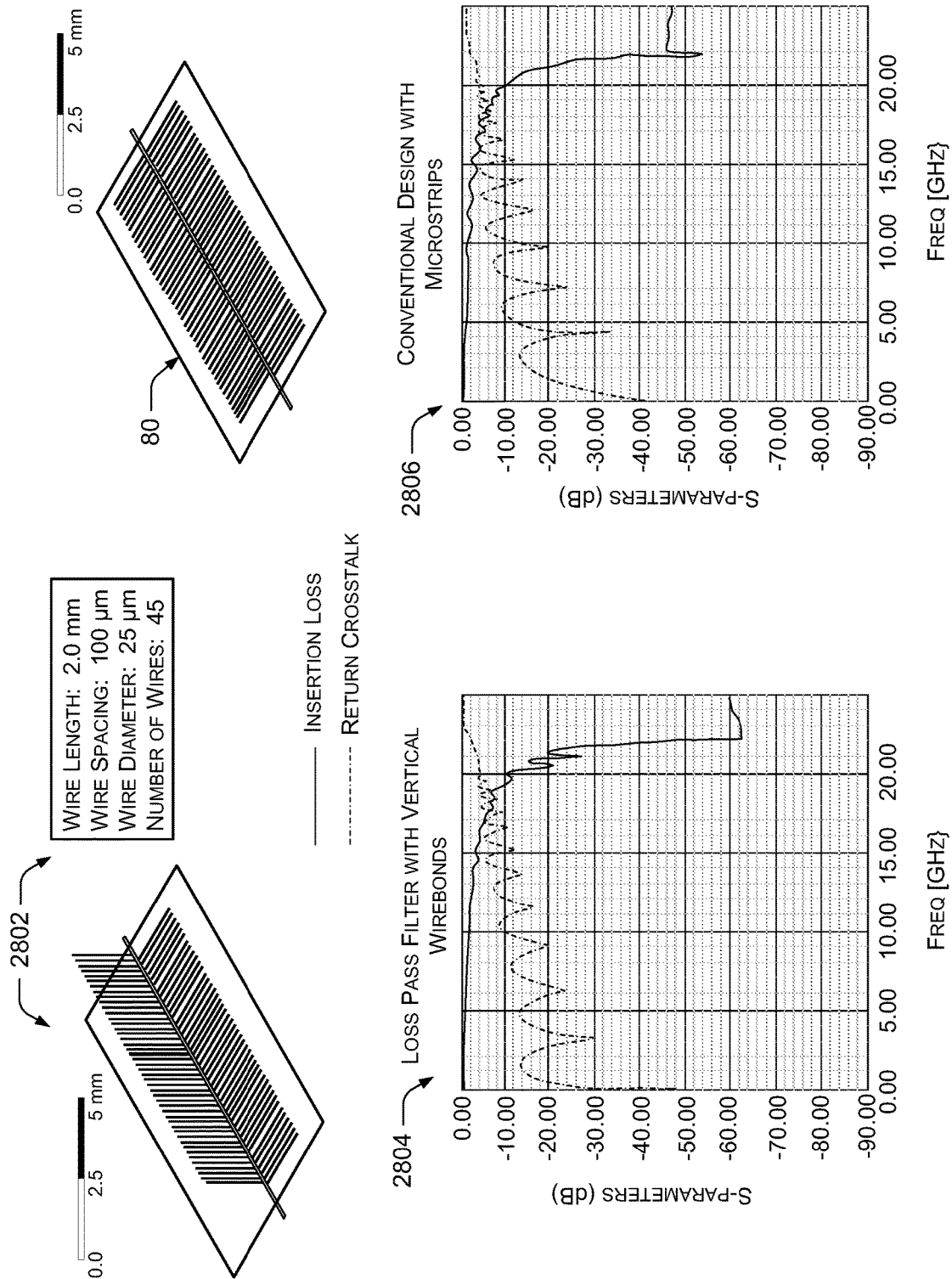
FIG. 28 is a diagram of example simulation results for a wirebond lowpass RF filter, including insertion loss and return crosstalk compared with a conventional lowpass RF filter.

FIG. 28 shows example simulation results for the shown wirebond lowpass RF filter 2802. Graph 2804 shows S-parameters versus frequency, including insertion loss and return crosstalk, for the example wirebond lowpass RF filter 2802. For comparison, graph 2806 compares S-parameters versus frequency for a conventional RF filter design 80 made with microstrips, including insertion loss and return crosstalk. The result are similar, indicating that the example wirebond lowpass RF filter 2802 suitably emulates the much larger and more expensive conventional RF filter design 80.

In the foregoing description and in the accompanying drawings, specific terminology and drawing symbols have been set forth to provide a thorough understanding of the disclosed embodiments. In some instances, the terminology and symbols may imply specific details that are not required to practice those embodiments. For example, any of the specific dimensions, quantities, material types, fabrication steps and the like can be different from those described above in alternative embodiments. The terms "example," "embodiment," and "implementation" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

In the specification and appended claims: the terms "connect," "connection," "connected," "in connection with," and "connecting," are used to mean "in direct connection with" or "in connection with via one or more elements." The terms "couple," "coupling," "coupled," "coupled together," and "coupled with," are used to mean "directly coupled together" or "coupled together via one or more elements."

While the present disclosure has been disclosed with respect to a limited number of embodiments, those skilled in the art, having the benefit of this disclosure, will appreciate numerous modifications and variations possible given the description. It is intended that the appended claims cover such modifications and variations as fall within the true spirit and scope of the disclosure.

The invention claimed is:

1. A method, comprising:
    depositing a conductive trace onto a flat surface of a substrate, the conductive trace forming a radio frequency (RF) filter element;
    laminating a plurality of instances of the substrate together in parallel planes of a horizontal stack to make a single solid-state RF filter package comprising a stack of the substrates and RF filter elements adhered together to make a distributed RF filter element, wherein at a vertical plane of the horizontal stack, the conductive traces forming the distributed RF filter element match a pattern of contact pads of a horizontal redistribution layer (RDL) on a horizontal motherboard;
    slicing the horizontal stack at the vertical plane; and
    bonding the sliced vertical plane of the horizontal stack to the horizontal motherboard to vertically flip the single solid-state RF filter package, including electrically connecting the conductive traces at the sliced vertical plane to the contact pads of the horizontal RDL of the horizontal motherboard.

2. The method of claim 1, further comprising depositing a conductive ground plane on at least one of the substrates, the conductive ground plane used in conjunction with at least one of the RF filter elements in the stack comprising the RF filter package to filter an RF signal.

3. The method of claim 1, further comprising creating a conductive via through a thickness of at least one of the substrates to conductively connect a first conductive trace forming a first RF filter element of the stack with a second conductive trace forming a second RF filter element of the stack; and connecting the respective RF filter elements of the corresponding plurality of substrates together in a series electrical connection or a parallel electrical connection.

4. The method of claim 1, wherein the conductive trace comprising the RF filter element includes a distributed filter element selected from the group consisting of a line short-circuited to ground and coupled to a main line of the conductive trace, a stub short-circuited to ground and in parallel with the main line, an open-circuit stub in parallel with the main line, coupled lines each short-circuited to ground, coupled open-circuit lines, a line having an abrupt change in width to provide a stepped impedance, a line having an abrupt end, a line possessing a hole or a slit, a line possessing a transverse half-slit across the line, a line possessing a gap, a line incorporating shunt resonators to provide a stepped-impedance lowpass filter, a line possessing alternate high and low impedance sections to provide a stepped-impedance lowpass filter, a line possessing stubs $\lambda/4$ apart on alternating sides of the line, paralleled radial stubs comprising butterfly stubs, doubled stubs in parallel, radial stubs, triple paralleled radial stubs comprising clover-leaf stubs, lines comprising a hairpin filter configuration, lines comprising an interdigital filter configuration, lines comprising a capacitive gap filter, parallel-coupled lines, and a line possessing $\lambda/4$ stubs short-circuited to ground.

5. The method of claim 1, further comprising adding at least one redistribution layer (RDL) to an outside surface of the stack comprising the RF filter package; and connecting a hardware to the redistribution layer, the hardware selected from the group consisting of an active semiconductor chip, a passive semiconductor device, an interposer, a substrate, a bump, and a pad.

6. The method of claim 1, further comprising depositing at least one alternative conductive trace on one of the plurality of substrates, the alternative conductive trace providing hardware selected from the group consisting of a metal plane providing a full ground plane, a metal plane providing a partial ground plane, a metal plane providing a full power plane, a metal plane providing a partial power plane, a coupler, a coil, a via-less interconnect, a transformer, an electromagnetic coil, a flat RF coil, an inductor, a resonator, a resistor, a sensor, an RFID tag, an antenna, a charge-receiving inductance coil, a radio frequency (RF) shield, at least part of a Faraday cage, a heat sink, a heat spreader, and at least a plate of a capacitor.

7. The method of claim 1, further comprising embedding a device in the laminated plurality of substrates, the embedding selected from the group consisting of recessing an active or passive electronic component in one of the substrates prior to the laminating, embedding a transformer, embedding a shunt, attaching the active or passive electronic component to one of the conductive traces on one of the substrates prior to the laminating, forming a coil from one of the conductive traces, forming an inductor from one of the conductive traces, forming a spiral inductor from one of the conductive traces, and forming an antenna from one of the conductive traces.

8. The method of claim 1, further comprising direct hybrid bonding the sliced vertical plane of the horizontal stack to the horizontal motherboard including to the contact pads of the horizontal RDL.

9. The method of claim 1 wherein the vertically flipped solid-state RF filter package has a vertical height of 50 microns or less.

10. A method for miniaturizing a horizontal planar RF filter, comprising:

creating each of distributed RF filter elements by depositing a conductive trace on respective substrates; laminating a stack of the distributed RF filter elements and associated substrates into a horizontal stack comprising a single solid-state RF filter module, wherein at a vertical plane of the horizontal stack, the RF elements match a pattern of contact pads of a horizontal redistribution layer (RDL) on a horizontal motherboard;

slicing the horizontal stack at the vertical plane; and bonding the sliced vertical plane of the horizontal stack to the horizontal motherboard to vertically flip the single solid-state RF filter module, including electrically connecting the RF elements at the sliced vertical plane to the contact pads of the horizontal RDL of the horizontal motherboard.

11. The method of claim 10 further comprising making each distributed RF filter element with vertical height of 0.05 mm or less.

12. The method of claim 10, wherein each distributed RF filter element is selected from the group consisting of:

a line short-circuited to ground and coupled to a main line of the conductive trace, a stub short-circuited to ground and in parallel with the main line, an open-circuit stub in parallel with the main line, coupled lines each short-circuited to ground, coupled open-circuit lines, a line having an abrupt change in width to provide a stepped impedance, a line having an abrupt end, a line possessing a hole or a slit, a line possessing a transverse half-slit across the line, a line possessing a gap, a line incorporating shunt resonators to provide a stepped-impedance lowpass filter, a line possessing alternate high and low impedance sections to provide a stepped-impedance lowpass filter, a line possessing stubs $\lambda/4$ apart on alternating sides of the line, paralleled radial stubs comprising butterfly stubs, doubled stubs in parallel, radial stubs, triple paralleled radial stubs comprising clover-leaf stubs, lines comprising a hairpin filter configuration, lines comprising an interdigital filter configuration, lines comprising a capacitive gap filter, parallel-coupled lines, and a line possessing $\lambda/4$ stubs short-circuited to ground.

13. The method of claim 10, further comprising direct hybrid bonding the sliced vertical plane of the horizontal stack to the horizontal motherboard including to the contact pads of the horizontal RDL.

14. A method, comprising:

depositing a first conductive trace and a second conductive trace on opposing sides of a substrate;

creating a conductive via through a thickness of the substrate for connecting the first conductive trace to the second conductive trace;

laminating a plurality of instances of the substrate in parallel planes to make a horizontal stack embedding the conductive traces, wherein the stack comprises an RF filter module, and wherein at a vertical plane of the horizontal stack, the conductive traces match a pattern of contact pads of a horizontal redistribution layer (RDL) on a horizontal motherboard;

slicing the horizontal stack at the vertical plane; and bonding the sliced vertical plane of the horizontal stack to the horizontal motherboard to vertically flip the RF filter module, including electrically connecting the conductive traces at the sliced vertical plane to the contact pads of the horizontal RDL of the horizontal motherboard.

15. The method of claim 14, wherein depositing the first conductive trace and the second conductive trace on opposing sides of a substrate further comprises depositing a conductive ground plane on the substrate.

16. The method of claim 14, further comprising depositing the first conductive trace or the second conductive trace as a distributed RF filter element selected from the group consisting of:

a line short-circuited to ground and coupled to a main line of the conductive trace, a stub short-circuited to ground and in parallel with the main line, an open-circuit stub in parallel with the main line, coupled lines each short-circuited to ground, a line having an abrupt change in width to provide a stepped impedance, a line having an abrupt end, a line possessing a hole or a slit, a line possessing a transverse half-slit across the line, a line possessing a gap, a line incorporating shunt resonators to provide a stepped-impedance lowpass filter, a line possessing alternate high and low impedance sections to provide a stepped-impedance lowpass filter, a line possessing stubs $\lambda/4$ apart on alternating sides of the line, paralleled radial stubs comprising butterfly stubs, doubled stubs in parallel, radial stubs, triple paralleled radial stubs comprising clover-leaf stubs, lines comprising a hairpin filter configuration, lines comprising an interdigital filter configuration, lines comprising a capacitive gap filter, parallel-coupled lines, and a line possessing $\lambda/4$ stubs short-circuited to ground.

17. The method of claim 14, wherein the first conductive trace or the second conductive trace comprises a full ground plane, a partial ground plane, a power plane, a coupler, a transformer element, an electromagnetic coil, a flat RF coil, a resonator, a resistor, an RFID tag, an antenna, an inductance coil, a radio frequency (RF) shield, at least part of a Faraday cage, a heat sink, a heat spreader, or at least a plate of a capacitor.

18. The method of claim 14, further comprising direct hybrid bonding the sliced vertical plane of the horizontal stack to the horizontal motherboard including to the contact pads of the horizontal RDL.

19. The method of claim 14, wherein the vertically flipped RF filter module has a vertical height of 50 microns or less.

* * * * *